United States Patent
Yamagami

(10) Patent No.: US 12,178,031 B2
(45) Date of Patent: Dec. 24, 2024

(54) SEMICONDUCTOR STORAGE DEVICE

(71) Applicant: SOCIONEXT INC., Kanagawa (JP)

(72) Inventor: Yoshinobu Yamagami, Kanagawa (JP)

(73) Assignee: SOCIONEXT INC., Kanagawa (JP)

( * ) Notice: Subject to any disclaimer, the term of this patent is extended or adjusted under 35 U.S.C. 154(b) by 470 days.

(21) Appl. No.: 17/553,675

(22) Filed: Dec. 16, 2021

(65) Prior Publication Data

US 2022/0108992 A1 Apr. 7, 2022

Related U.S. Application Data

(63) Continuation of application No. PCT/JP2020/022719, filed on Jun. 9, 2020.

(30) Foreign Application Priority Data

Jun. 17, 2019 (JP) .................. 2019-112086

(51) Int. Cl.
| | | |
|---|---|---|
| H10B 10/00 | (2023.01) | |
| H01L 29/06 | (2006.01) | |
| H01L 29/423 | (2006.01) | |
| H01L 29/775 | (2006.01) | |
| H01L 29/786 | (2006.01) | |

(52) U.S. Cl.
CPC ....... *H10B 10/125* (2023.02); *H01L 29/0673* (2013.01); *H01L 29/42392* (2013.01); *H01L 29/775* (2013.01); *H01L 29/78696* (2013.01)

(58) Field of Classification Search
None
See application file for complete search history.

(56) References Cited

U.S. PATENT DOCUMENTS

| | | | |
|---|---|---|---|
| 2009/0294861 A1* | 12/2009 | Thomas | H01L 27/1203 257/E27.098 |
| 2014/0191338 A1* | 7/2014 | Nii | G11C 8/16 257/401 |
| 2018/0026042 A1 | 1/2018 | Smith et al. | |
| 2018/0040695 A1 | 2/2018 | Smith et al. | |

(Continued)

FOREIGN PATENT DOCUMENTS

| | | |
|---|---|---|
| JP | 2009-295975 A | 12/2009 |
| JP | 2018-26565 A | 2/2018 |

(Continued)

OTHER PUBLICATIONS

International Search Report issued in International Patent Application No. PCT/JP2020/022719, mailed on Aug. 11, 2020; with partial English translation.

(Continued)

Primary Examiner — Nishath Yasmeen
(74) Attorney, Agent, or Firm — Rimon P.C.

(57) ABSTRACT

Static Random Access Memory (SRAM) cell using Complementary FET (CFET) includes the first to sixth transistors each of which is a three-dimensional transistor. The first to fourth transistors are formed at the same position as each other in the first direction in which channel portions of the first to sixth transistors extend. The fifth transistor having a node connected to the first bit line and the sixth transistor having a node connected to the second bit line are formed at the same position in the first direction as each other.

16 Claims, 17 Drawing Sheets

(56) References Cited

U.S. PATENT DOCUMENTS

2018/0047832 A1*  2/2018  Tapily ............... H01L 29/66545
2018/0342522 A1  11/2018  Nii et al.
2019/0139966 A1   5/2019  Nii et al.

FOREIGN PATENT DOCUMENTS

WO         2013/018156 A1    2/2013
WO     WO-2014185085 A1 *  11/2014  ......... H01L 27/0688

OTHER PUBLICATIONS

Written Opinion issued in International Patent Application No. PCT/JP2020/022719, mailed on Aug. 11, 2020; with partial English translation.
Ryckaert J. et al., "The Complementary FET (CFET) for CMOS scaling beyond N3," 2018 Symposium on VLSI Technology Digest of Technical Papers; 2018 IEEE pp. 141-142.
A. Mocuta et al., "Enabling CMOS Scaling Towards 3nm and Beyond," 2018 Symposium on VLSI Technology Digest of Technical Papers, 2018 IEEE, pp. 147-148.

* cited by examiner

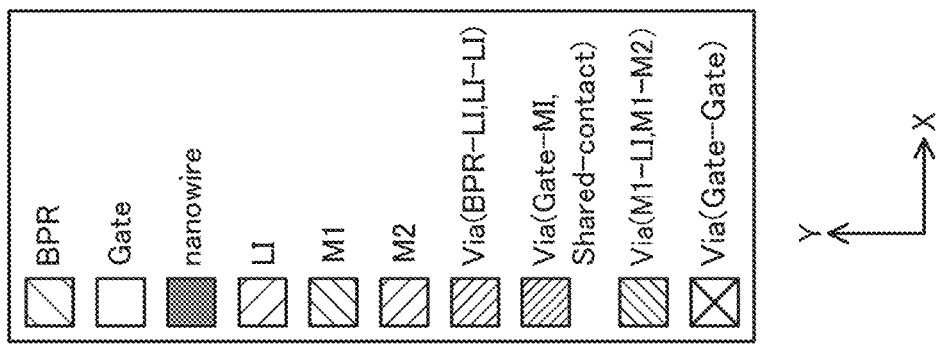
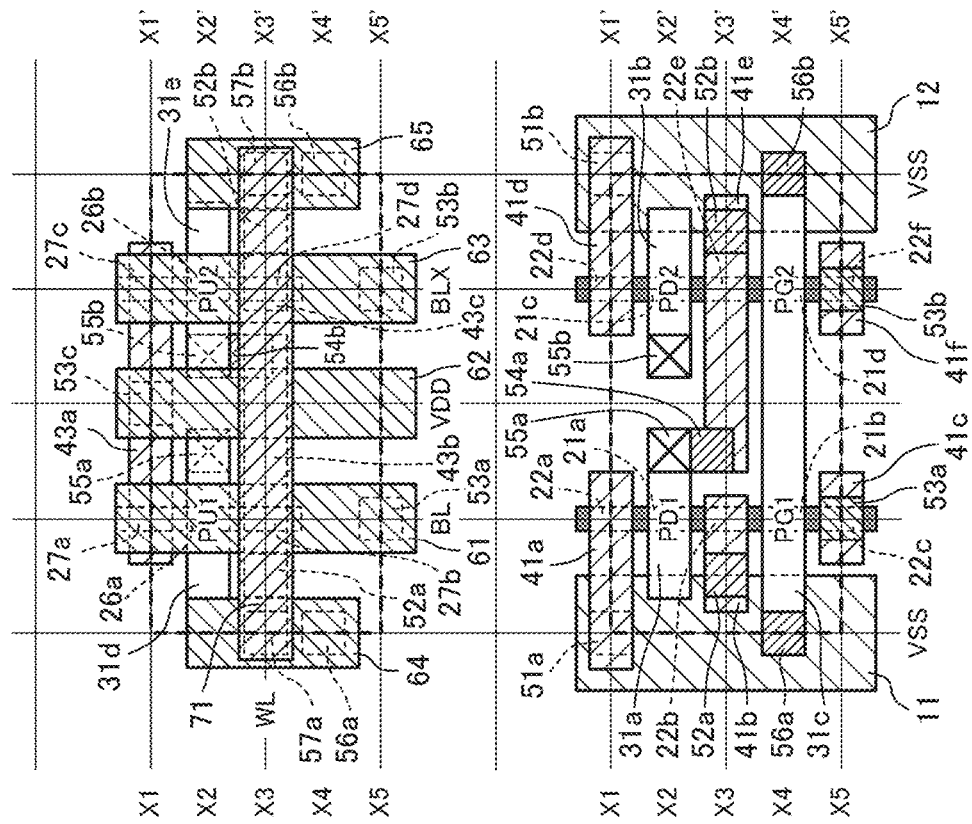
FIG.1A UPPER PART(Pch)
FIG.1B LOWER PART(Nch)

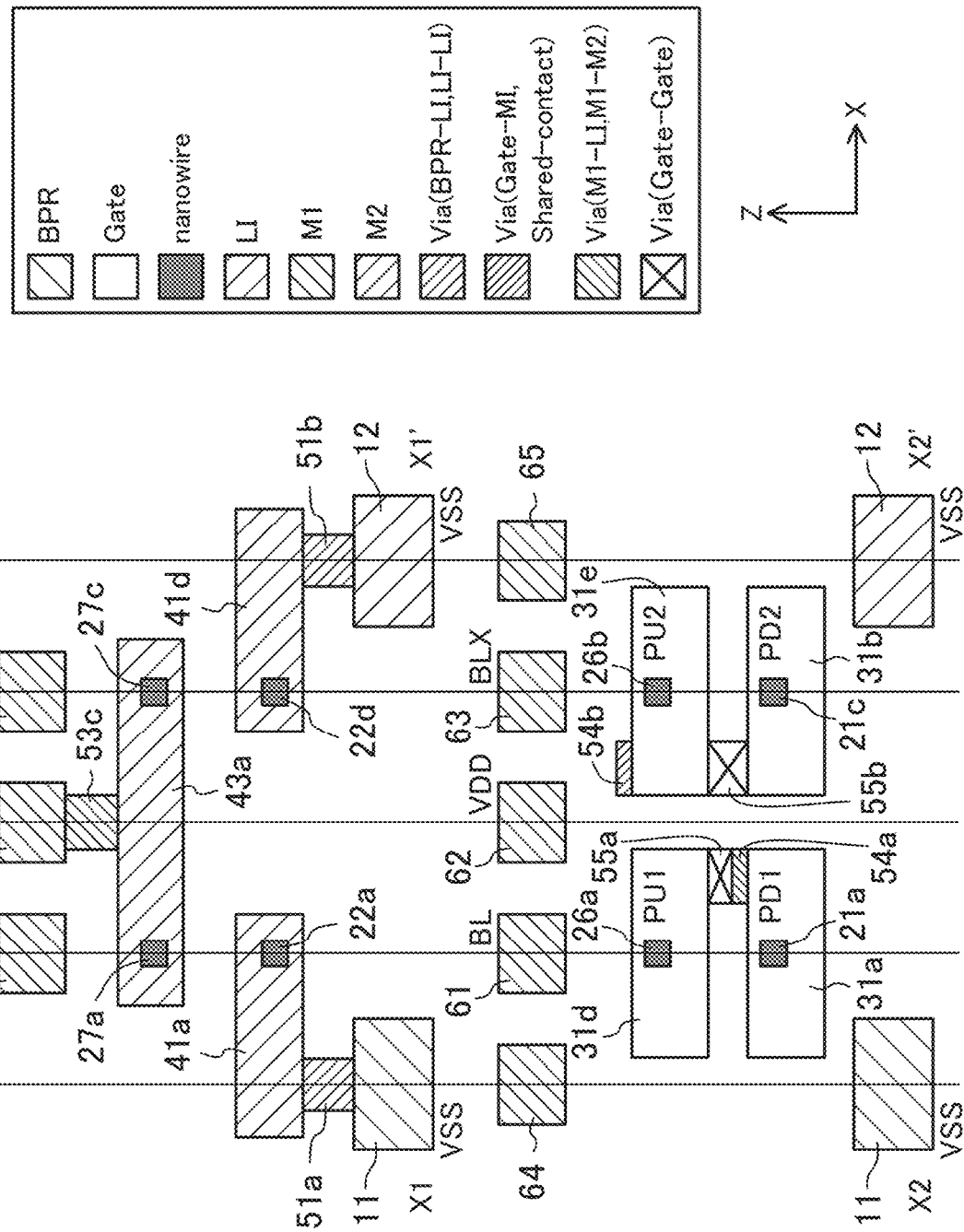

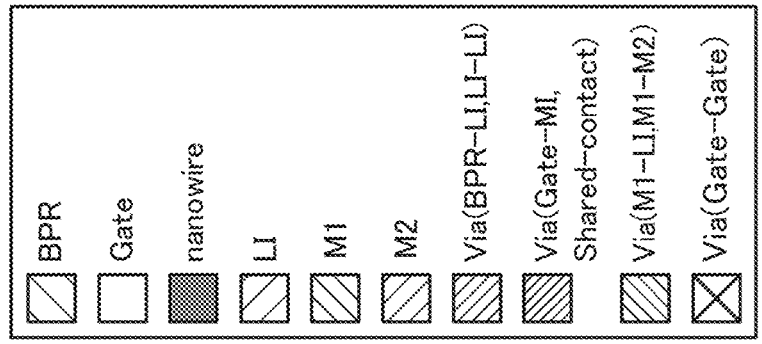
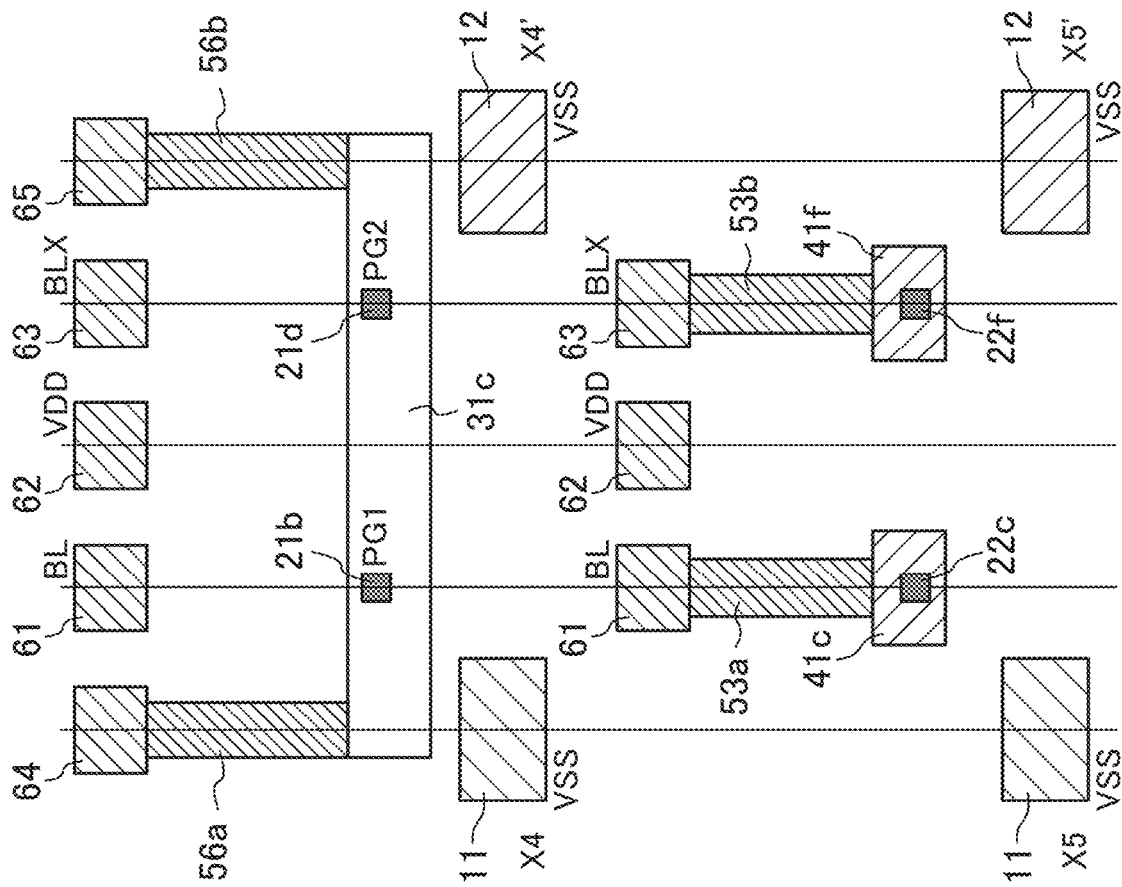
FIG.4A
FIG.4B

COMPARATIVE EXAMPLE

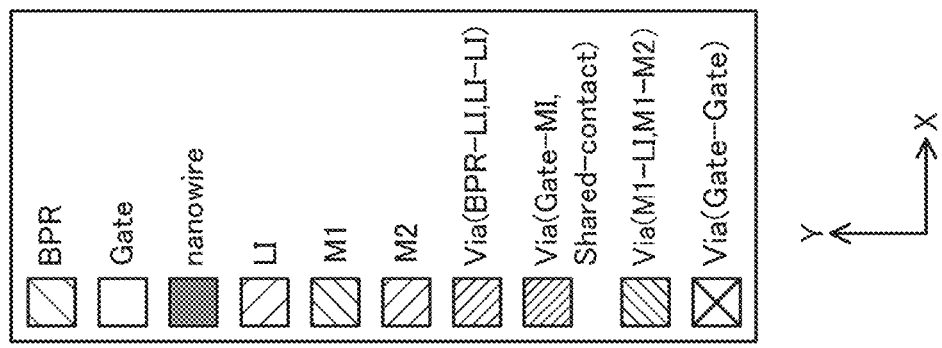
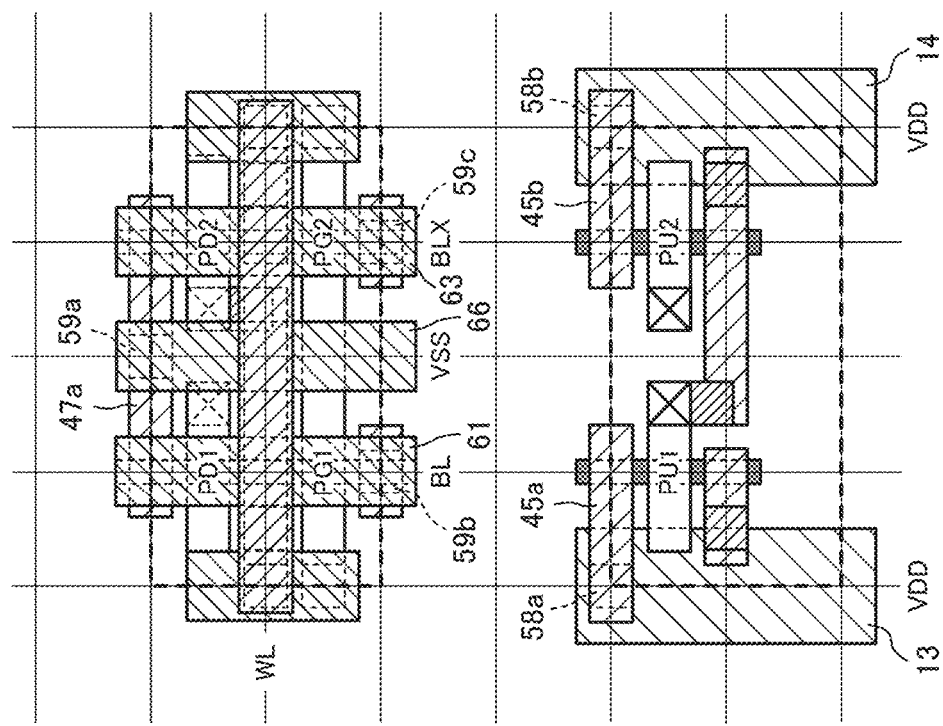
FIG.7A UPPER PART(Nch)
FIG.7B LOWER PART(Pch)

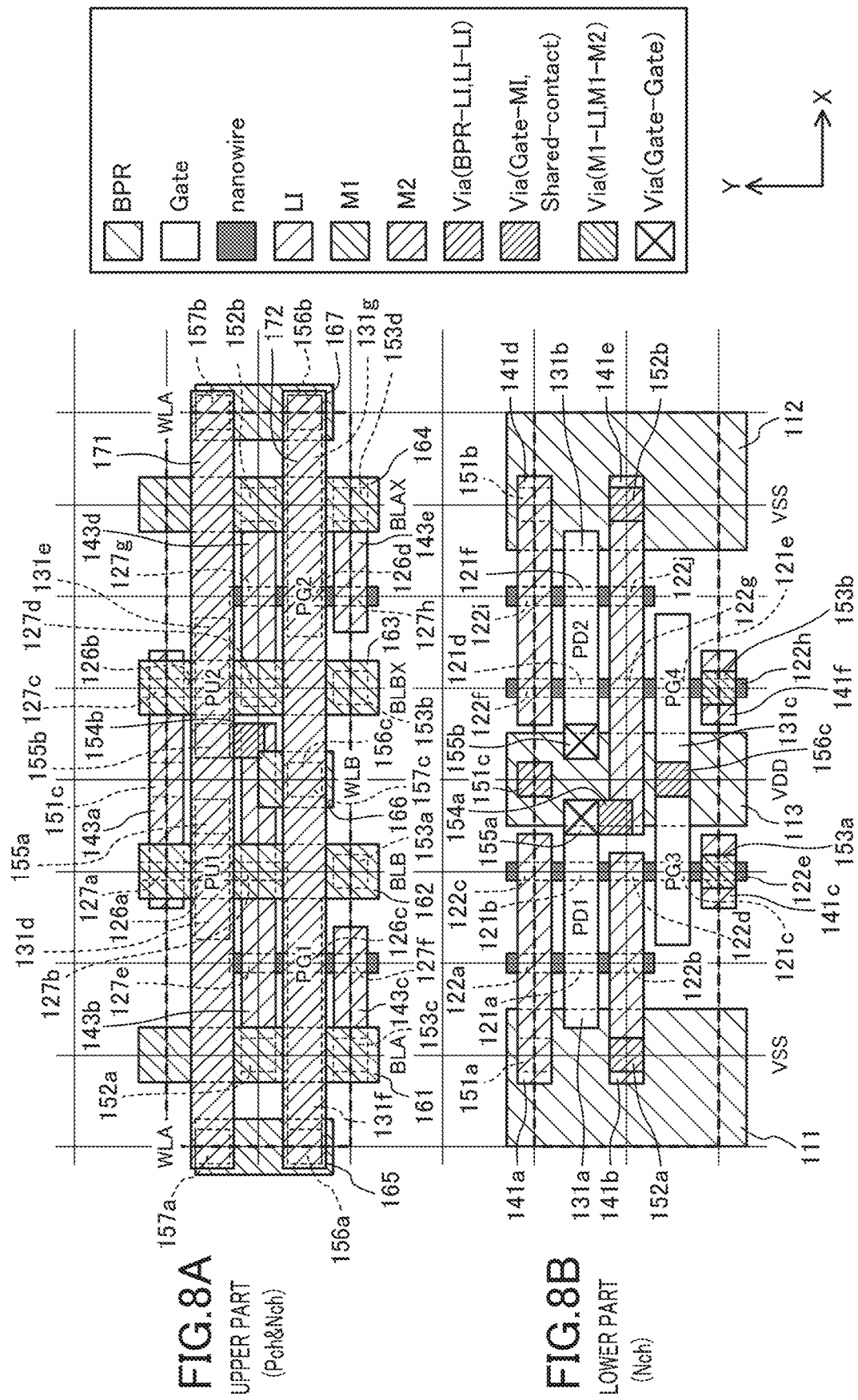

SEMICONDUCTOR STORAGE DEVICE

CROSS-REFERENCE TO RELATED APPLICATIONS

This is a continuation of International Application No. PCT/JP2020/022719 filed on Jun. 9, 2020, which claims priority to Japanese Patent Application No. 2019-112086 filed on Jun. 17, 2019. The entire disclosures of these applications are incorporated by reference herein.

BACKGROUND

The present disclosure relates to a semiconductor storage device using Complementary FET (CFET) devices, and more particularly to a layout structure of an SRAM (Static Random Access Memory) cell using CFETs.

An SRAM (Static Random Access Memory) is widely used in semiconductor integrated circuits.

As for transistors as basic constituents of an LSI, scaling down of the gate length has led to the improvement in integration degree, the reduction in operating voltage, and the improvement in operating speed. Recently, however, increase in off current due to excessive scaling and the resulting significant increase in power consumption have raised a problem. To solve this problem, three-dimensional transistors having a three-dimensional structure changed from the conventional planar structure have been vigorously studied.

Ryckaert J. et al., "The Complementary FET (CFET) for CMOS Scaling Beyond N3," 2018 Symposium on VLSI Technology Digest of Technical Papers and A. Mocuta et al., "Enabling CMOS Scaling Towards 3 nm and Beyond," 2018 Symposium on VLSI Technology Digest of Technical Papers disclose three-dimensional devices in which three-dimensional p-type FET and n-type FET are stacked vertically to a substrate, as novel devices, and SRAM cells using such devices.

As used herein, a three-dimensional device in which three-dimensional p-type FET and n-type FET are stacked vertically to a substrate is called a complementary FET (CFET) following the cited paper by Ryckaert J. et al. Also, the direction vertical to the substrate is herein called the depth direction.

In Ryckaert J. et al., an example of a layout structure of an SRAM is briefly disclosed (FIG. 4). But, in Ryckaert J. et al., the property of an SRAM cell using CFETs has not been studied at all.

An objective of the present disclosure is providing a layout structure with favorable property of an SRAM cell using CFETs.

SUMMARY

According to the first mode of the present disclosure, a semiconductor storage device including an SRAM (Static Random Access Memory) cell, the SRAM cell comprising: a first transistor, one node of which is connected to a first power supply for supplying a first voltage, the other node of which is connected to a first node, and a gate of which is connected to a second node; a second transistor, one node of which is connected to the first power supply, the other node of which is connected to the second node, and a gate of which is connected to the first node; a third transistor, one node of which is connected to the first node, the other node of which is connected to a second power supply for supplying a second voltage different from the first voltage, and a gate of which is connected to the second node; a fourth transistor, one node of which is connected to the second node, the other node of which is connected to the second power supply, and a gate of which is connected to the first node; a fifth transistor, one node of which is connected to a first bit line, the other node of which is connected to the first node, and a gate of which is connected to a first word line; and a sixth transistor, one node of which is connected to a second bit line constituting a complementary bit line pair with the first bit line, the other node of which is connected to the second node, and a gate of which is connected to the first word line, wherein each of the first and second transistors is a three-dimensional transistor of a first conductivity type formed in a first layer, each of the third to sixth transistors is a three-dimensional transistor of a second conductivity type different from the first conductivity type, and is formed in a second layer different from the first layer, the first and second transistors overlap the third and fourth transistors as viewed in plan at least partially, respectively, the first to fourth transistors are formed at a same position as each other in a first direction in which channel portions of the first to sixth transistors extend, and the fifth and sixth transistors are formed at a same position as each other in the first direction.

According to this aspect, in the SRAM cell including the first to sixth transistors, the fifth transistor one node of which is connected to the first bit line and the sixth transistor one node of which is connected to the second bit line are formed at the same position as each other in the first direction in which the channel portions of the first to sixth transistors extend. Thus, in a configuration in which a plurality of SRAM cells are arranged side by side in the first direction, the contact for connecting each SRAM cell and the first bit line and the contact for connecting each SRAM cell and the second bit line can be arranged in alignment in the first direction. Therefore, since the load capacitance between the bit lines constituting the complementary bit line pair can be kept balanced, good characteristics can be realized for SRAM cells using CFETs.

According to the second mode of the present disclosure, a semiconductor storage device including an SRAM (Static Random Access Memory) cell, the SRAM cell comprising: a first transistor, one node of which is connected to a first power supply for supplying a first voltage, the other node of which is connected to a first node, and a gate of which is connected to a second node; a second transistor, one node of which is connected to the first power supply, the other node of which is connected to the second node, and a gate of which is connected to the first node; a third transistor, one node of which is connected to the first node, the other node of which is connected to a second power supply for supplying a second voltage different from the first voltage, and a gate of which is connected to the second node; a fourth transistor, one node of which is connected to the second node, the other node of which is connected to the second power supply, and a gate of which is connected to the first node; a fifth transistor, one node of which is connected to a first bit line, the other node of which is connected to the first node, and a gate of which is connected to a first word line; a sixth transistor, one node of which is connected to a second bit line constituting a complementary bit line pair with the first bit line, the other node of which is connected to the second node, and a gate of which is connected to the first word line; a seventh transistor, one node of which is connected to a third bit line, the other node of which is connected to the first node, and a gate of which is connected to a second word line; and an eighth transistor, one node of which is connected to a fourth bit line constituting a complementary bit line pair with the third bit line, the other node of which is connected to the second node, and a gate of which is connected to the second word line; wherein each of the first and second transistors is a three-dimensional transistor of a first conductivity type formed in a first layer, each of the third and fourth transistors is a three-dimensional transistor of a second conductivity type different from the first conductivity type, formed in a second layer different from the first layer, the first and second transistors overlap the third and fourth transistors as viewed in plan at least partially, respectively, the first to fourth transistors are formed at a same position as each other in a first direction in which channel portions of the first to eighth transistors extend, the fifth and sixth transistors are formed in one of the first and second layers, the seventh and eighth transistors are formed in one of the first and second layers, and the fifth to eighth transistors are formed at a same position as each other in the first direction.

According to this aspect, in the SRAM cell including the first to eighth transistors, the fifth transistor one node of which is connected to the first bit line, the sixth transistor one node of which is connected to the second bit line, the seventh transistor one node of which is connected to the third bit line, and the eighth transistor one node of which is connected to the fourth bit line are formed at the same position as each other in the first direction in which the channel portions of the first to eighth transistors extend. Thus, in a configuration in which a plurality of SRAM cells are arranged side by side in the first direction, the contact for connecting each SRAM cell and the first bit line and the contact for connecting each SRAM cell and the second bit line can be arranged in alignment in the first direction. Further, the contact for connecting each SRAM cell and the third bit line and the contact for connecting each SRAM cell and the fourth bit line can be arranged in alignment with each other in the first direction. Therefore, since the load capacitance between the bit lines constituting the complementary bit line pair can be kept balanced, good characteristics can be realized for SRAM cells using CFETs.

According to the third mode of the present disclosure, a semiconductor storage device including an SRAM (Static Random Access Memory) cell, the SRAM cell comprising: a first transistor, one node of which is connected to a first power supply for supplying a first voltage, the other node of which is connected to a first node, and a gate of which is connected to a second node; a second transistor, one node of which is connected to the first power supply, the other node of which is connected to the second node, and a gate of which is connected to the first node; a third transistor, one node of which is connected to the first node, the other node of which is connected to a second power supply for supplying a second voltage different from the first voltage, and a gate of which is connected to the second node; a fourth transistor, one node of which is connected to the second node, the other node of which is connected to the second power supply, and a gate of which is connected to the first node; a fifth transistor, one node of which is connected to a first write bit line, the other node of which is connected to the first node, and a gate of which is connected to a write word line; a sixth transistor, one node of which is connected to a second write bit line constituting a complementary bit line pair with the first write bit line, the other node of which is connected to the second node, and a gate of which is connected to the write word line; a seventh transistor, one node of which is connected to the second power supply and a gate of which is connected to the second node; and an eighth transistor, one node of which is connected to a first read bit line, the other node of which is connected to the other node of the seventh transistor, and a gate of which is connected to a read word line; wherein each of the first and second transistors is a three-dimensional transistor of a first conductivity type formed in a first layer, each of the third to sixth transistors is a three-dimensional transistor of a second conductivity type different from the first conductivity type, formed in a second layer different from the first layer, the first and second transistors overlap the third and fourth transistors as viewed in plan at least partially, respectively, the first to fourth transistors are formed at a same position as each other in a first direction in which channel portions of the first to eighth transistors extend, and the fifth and sixth transistors are formed at a same position as each other in the first direction.

According to this aspect, in the SRAM cell including the first to eighth transistors, the fifth transistor one node of which is connected to the first write bit line and the sixth transistor one node of which is connected to the second write bit line are formed at the same position as each other in the first direction in which the channel portions of the first to eighth transistors extend. Thus, in a configuration in which a plurality of SRAM cells are arranged side by side in the first direction, the contact for connecting each SRAM cell and the first write bit line and the contact for connecting each SRAM cell and the second write bit line can be arranged in alignment in the first direction. Therefore, since the load capacitance between the bit lines constituting the complementary bit line pair can be kept balanced, good characteristics can be realized for SRAM cells using CFETs.

According to the present disclosure, a layout structure with favorable property of an SRAM cell using CFETs can be provided.

BRIEF DESCRIPTION OF THE DRAWINGS

FIGS. 1A and 1B are plan views showing an example of a layout structure of an SRAM cell according to the first embodiment.

FIGS. 2A and 2B are cross-sectional views of the SRAM cell of FIGS. 1A and 1B.

FIGS. 4A and 4B are cross-sectional views of the SRAM cell of FIGS. 1A and 1B.

FIGS. 7A and 7B are plan views showing an example of a layout structure of an SRAM cell according to an alteration of the first embodiment.

FIGS. 8A and 8B are plane views showing an example of a layout structure of an SRAM cell according to the second embodiment.

DETAILED DESCRIPTION

Figure 14:
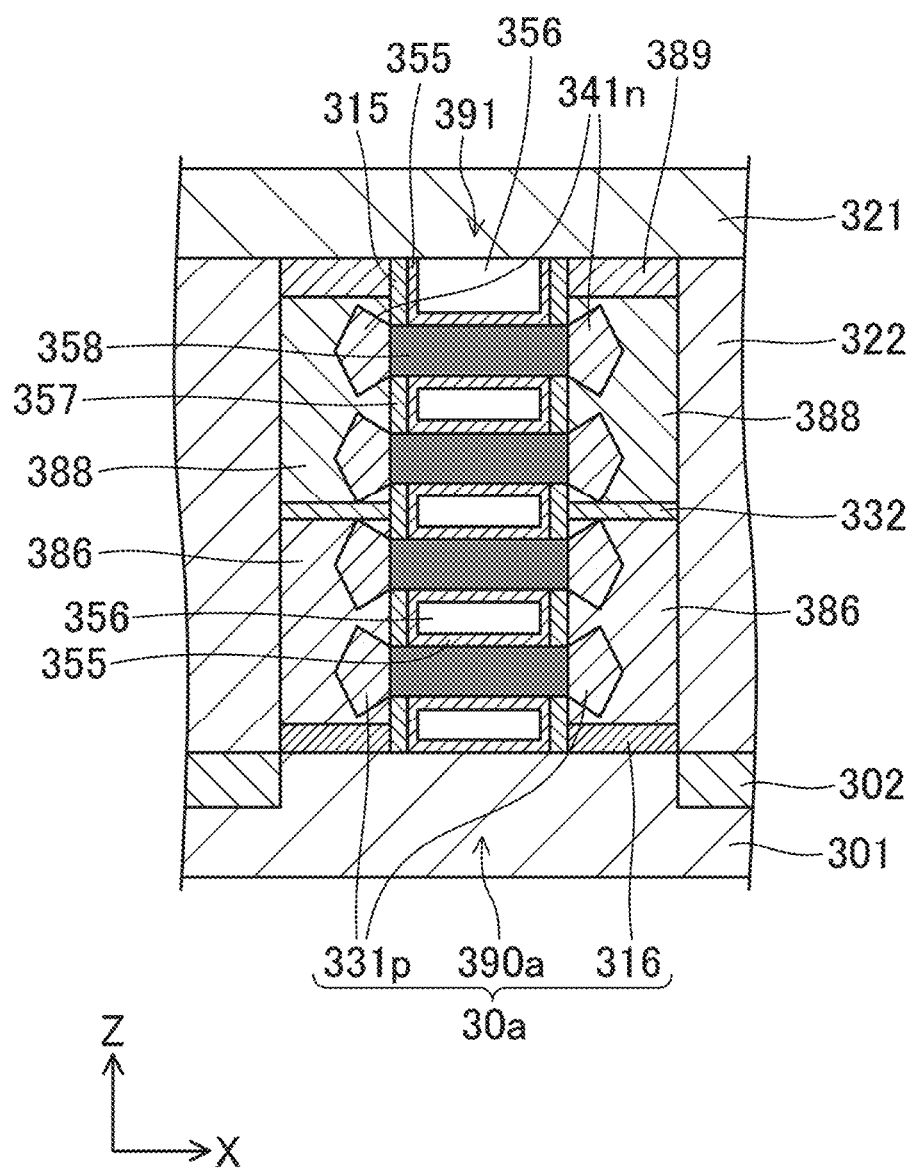
FIG. 14 is a cross-sectional view showing a structure of a semiconductor device provided with a CFET.
Figure 15:
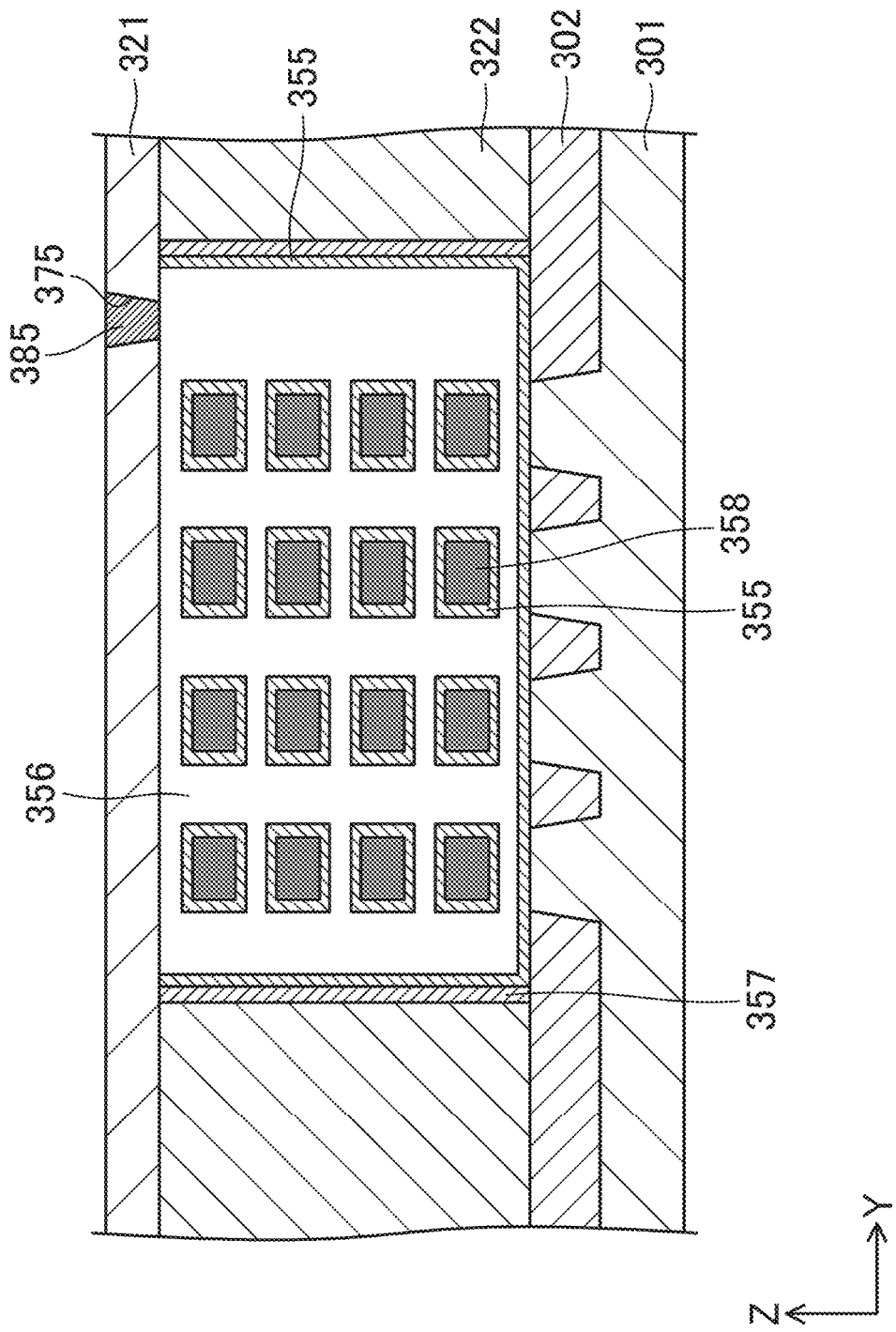
FIG. 15 is a cross-sectional view showing the structure of the semiconductor device provided with a CFET.
Figure 16:
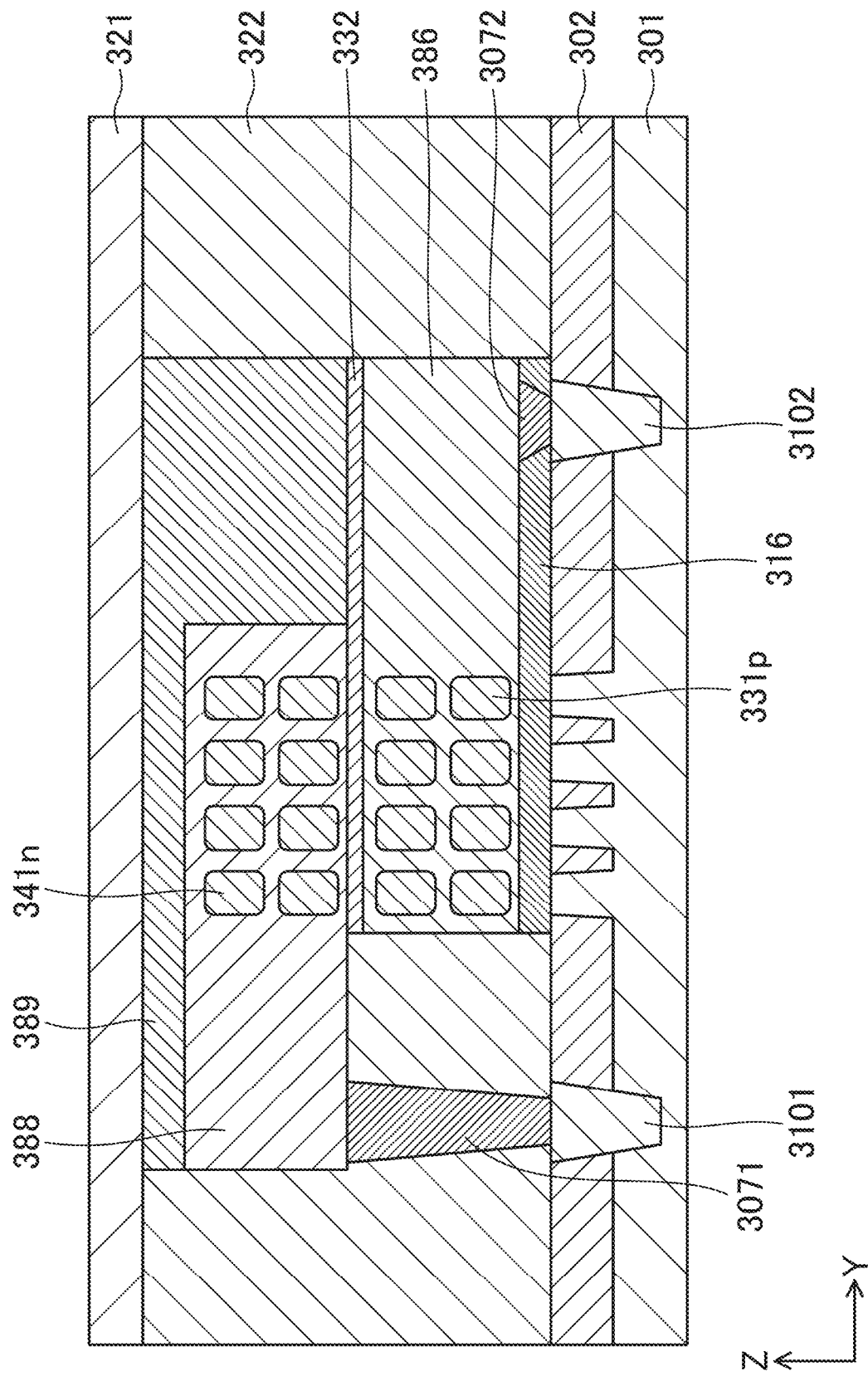
FIG. 16 is a cross-sectional view showing the structure of the semiconductor device provided with a CFET.
Figure 17:
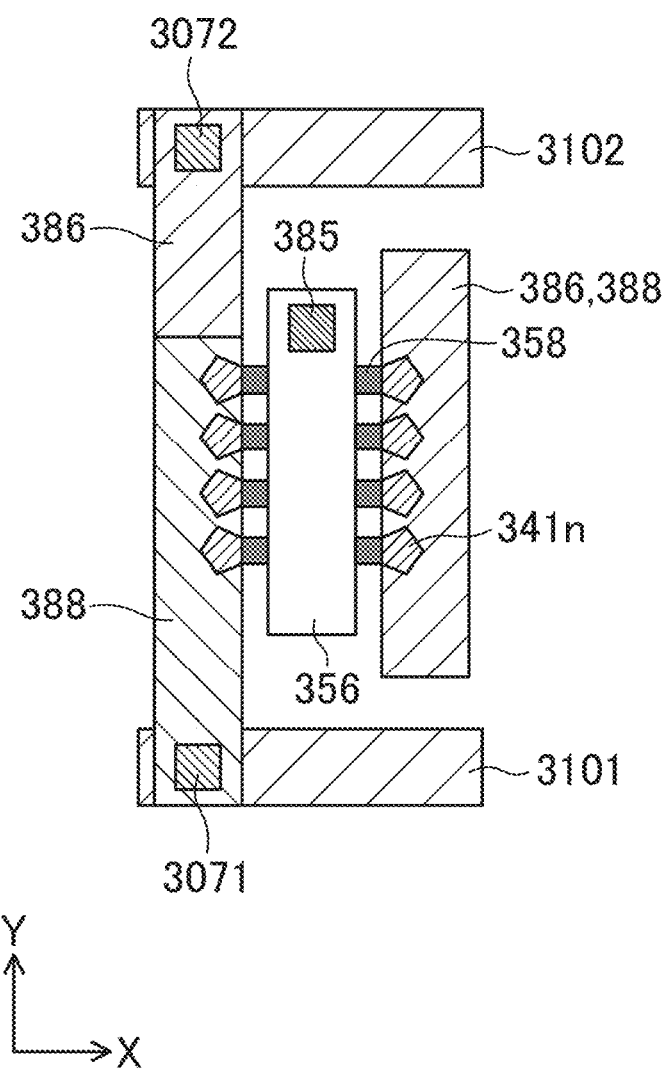
FIG. 17 is a plan view showing the structure of the semiconductor device provided with a CFET.

First, the basic structure of the CFET will be described. FIGS. 14 to 17 are views showing a structure of a semiconductor device provided with a CFET, where FIG. 14 is a cross-sectional view taken in an X direction, FIG. 15 is a cross-sectional view of a gate portion taken in a Y direction, FIG. 16 is a cross-sectional view of a source/drain portion taken in the Y direction, and FIG. 17 is a plan view. Note that the X direction refers to the direction in which nanowires extend, the Y direction refers to the direction in which a gate extends, and a Z direction refers to the direction vertical to the substrate plane. Note also that FIGS. 14 to 17 are schematic views in which the sizes and positions of the components are not necessarily consistent with one another.

In this semiconductor device, an element isolation region 302 is formed on a semiconductor substrate 301 such as a silicon (Si) substrate, and an element active region 30a is defined by the element isolation region 302. In the element active region 30a, an n-type FET is formed above a p-type FET.

In the element active region 30a, a stacked transistor structure 390a is formed on the semiconductor substrate 301. The stacked transistor structure 390a includes a gate structure 391 formed on the semiconductor substrate 301. The gate structure 391 includes a gate electrode 356, a plurality of nanowires 358, gate insulating films 355, and an insulating film 357. The gate electrode 356 extends in the Y direction and stands in the Z direction. The nanowires 358 extend through the gate electrode 356 in the X direction, and are arranged in the Y and Z directions. The gate insulating films 355 are formed between the gate electrode 356 and the nanowires 358. The gate electrode 356 and the gate insulating films 355 extend only up to positions receding from both ends of the nanowires 358 in the X direction, and the insulating film 357 is formed to fill the resultant recesses. An insulating film 316 is formed on the semiconductor substrate 301 to lie on both sides of the insulating film 357. The reference numerals 321 and 322 denote inter-layer insulating films.

As shown in FIG. 15, the gate electrode 356 is connected to an interconnect in an upper layer through a via 385 formed in an opening 375.

For the gate electrode 356, titanium, a titanium nitride, or polysilicon, for example, can be used. For the gate insulating films 355, a high dielectric constant material such as a hafnium oxide, an aluminum oxide, or an oxide of hafnium and aluminum, for example, can be used. For the nanowires 358, silicon, for example, can be used. For the insulating film 316 and the insulating film 357, a silicon oxide or a silicon nitride, for example, can be used.

In this semiconductor device, the number of nanowires 358 arranged in the Z direction is four. In the element active region 30a, p-type semiconductor layers 331p are formed at both ends of two nanowires 358 closer to the semiconductor substrate 301. Two local interconnects 386 in contact with the p-type semiconductor layers 331p are formed to sandwich the gate structure 391 in the X direction. Also, n-type semiconductor layers 341n are formed at both ends of two nanowires 358 apart from the semiconductor substrate 301. Two local interconnects 388 in contact with the n-type semiconductor layers 341n are formed to sandwich the gate structure 391 in the X direction. An insulating film 332 is formed between the local interconnects 386 and the local interconnects 388. An insulating film 389 is formed on the local interconnects 388. The p-type semiconductor layers 331p are p-type SiGe layers, and the n-type semiconductor layers 341n are n-type Si layers, for example. For the insulating film 332, a silicon oxide or a silicon nitride, for example, can be used.

Also, as shown in FIG. 16, the local interconnect 388 is connected with a buried interconnect 3101 through a via 3071, and the local interconnect 386 is connected with a buried interconnect 3102 through a via 3072.

As described above, the stacked transistor structure 390a has a p-type FET including the gate electrode 356, nanowires 358, gate insulating films 355, and the p-type semiconductor layers 331p. In the p-type FET, ones of the p-type semiconductor layers 331p on one side function as source regions, the other p-type semiconductor layers 331p on the other side function as drain regions, and the nanowires 358 function as channels. The stacked transistor structure 390a also has an n-type FET including the gate electrode 356, nanowires 358, gate insulating films 355, and the n-type semiconductor layers 341n. In the n-type FET, ones of the n-type semiconductor layers 341n on one side function as source regions, the other n-type semiconductor layers 341n on the other side function as drain regions, and the nanowires 358 function as channels.

Note that layers above the stacked transistor structure are used for wiring between transistors through vias and metal interconnects, which can be implemented by known wiring processes.

While the number of nanowires in each of the p-type FET and the n-type FET is four in the Y direction and two in the Z direction, i.e., eight in total, it is not limited to this. Also, the numbers of nanowires in the p-type FET and the n-type FET may be different from each other.

As used herein, a semiconductor layer portion formed on each end of a nanowire to constitute a terminal that is to be the source or drain of a transistor is called a "pad." In the illustrated example of the basic structure of the CFET, the p-type semiconductor layers 331p and the n-type semiconductor layers 341n correspond to pads.

Note that, in the plan views and cross-sectional views in the following embodiments, illustration of various insulating films may be omitted in some cases. Also, nanowires and pads at both ends of the nanowires may be illustrated in simplified linear shapes in some cases. Also, as used herein, an expression indicating that sizes, etc. are identical, such as the "same size," is to be understood as including a range of manufacturing variations.

Also, in subsequent embodiments, the source and drain of the transistor may be referred to a node of the transistor.

In addition, "VDD" and "VSS" represent power supply voltages, or the power supplies themselves.

In CFETs, stacking a P-type FET and an N-type FET is a basic structure. Note that partially, transistors can be formed only in an upper layer or only in a lower layer. The following is a method of forming transistors in this case.

1) After the upper transistors are formed, the upper transistors are partially removed. Removal of the transistors is accomplished by removal of the pads or by removal of the gates and pads. Thus, a region in which a transistor is formed only in the lower layer is constituted. Similarly, after the lower transistors are formed, the lower transistors are partially removed. Thus, a region in which a transistor is formed only in the upper layer is constituted.

2) In forming the pads of the upper transistor by epitaxial growth, the pads are partially non-formed. Thus, a region in which a transistor is formed only in the lower layer is constituted. Similarly, when the pads of the lower transistors are formed by epitaxial growth, the pads are partially non-formed. Thus, a region in which a transistor is formed only in the upper layer is constituted.

The gates of the lower and upper transistors can be formed separately. For example, after forming the gate of the lower transistor, an insulating film is formed on the gate, and then the gate of the upper transistor is formed. In this configuration, an opening is provided in the insulating film between the lower gate and the upper gate, and by providing a conductor in the opening, it is possible to electrically connect the lower gate and the upper gate.

First Embodiment

Figure 3:
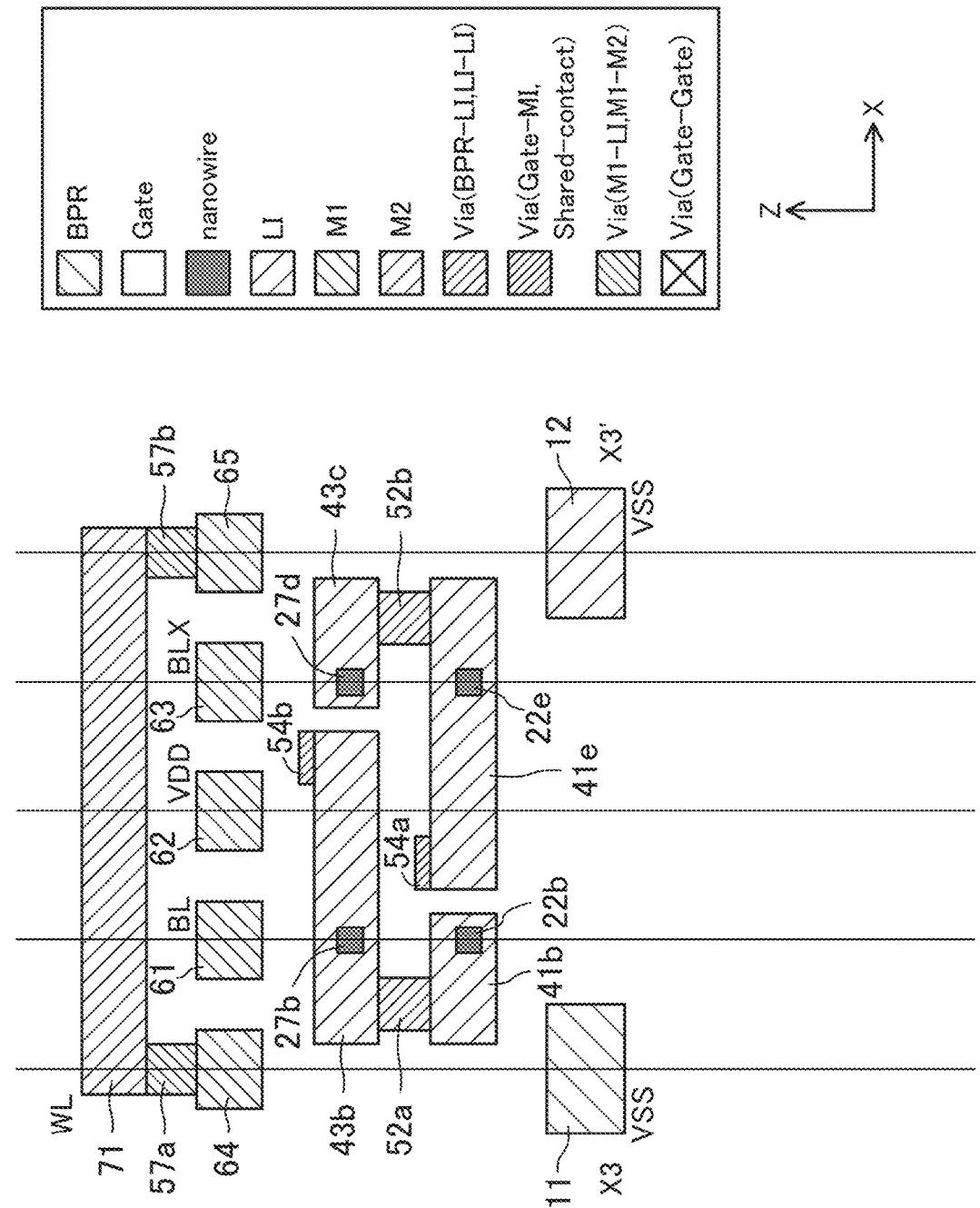
FIG. 3 is a cross-sectional view of the SRAM cell of FIGS. 1A and 1B.

FIGS. 1A-1B to 4A-4B are views showing an example of a layout structure of an SRAM cell according to the first embodiment, where FIGS. 1A-1B are plan views of an SRAM cell, and FIGS. 2A-2B, 3 and 4A and 4B are cross-sectional views of the SRAM cell taken in the transverse direction as viewed in plan. Specifically, FIG. 1A shows an upper part, i.e., a portion including three-dimensional transistors formed away from a substrate (here, P-type nanowire FETs), and FIG. 1B shows a lower part, i.e., a portion including three-dimensional transistors formed closer to the substrate (here, N-type nanowire FETs). FIG. 2A shows a cross section taken along line X1-X1', FIG. 2B shows a cross section taken along line X2-X2', FIG. 3 shows a cross section taken along line X3-X3', FIG. 4A shows a cross section taken along line X4-X4', and FIG. 4B shows a cross section taken along line X5-X5'.

In the following description, in the plan views such as FIGS. 1A-1B, the horizontal direction in the figure is called X direction (corresponding to the second direction), the vertical direction in the figure is called Y direction (corresponding to the first direction), and the direction vertical to the substrate surface is called Z direction (corresponding to the depth direction). Note that the X direction is the direction in which gate interconnects and word lines extend and the Y direction is the direction in which the nanowires and bit lines extend. That is, in the drawings of this and subsequent embodiment, the X and Y directions are reversed from those of FIGS. 14 to 17. Thin solid lines running vertically and horizontally in the plan views such as FIGS. 1A and 1B, and thin solid lines running vertically in the cross-sectional views such as FIG. 2 represent grid lines used for placement of components at the time of designing. The grid lines are arranged at equal intervals in the X direction, also are arranged at equal intervals in the Y direction. The grid intervals may be the same or different in the X direction and the Y direction. Also, the grid intervals may be different between layers. Further, the components are not necessarily required to be placed on grid lines. However, from the viewpoint of reducing manufacturing variations, it is preferable to place the components on grid lines.

Further, in the plan views of FIGS. 1A-1B or the like, a broken line indicates a frame of the SRAM cell. In the present embodiment, when arranging SRAM cells in arrays, SRAM cells adjoining in the X direction may be arranged as they are, or one of them may be inverted with respect to the Y-axis. Further, SRAM cells adjoining in the Y direction are arranged by inverting one of them with respect to the X-axis.

Figure 5:
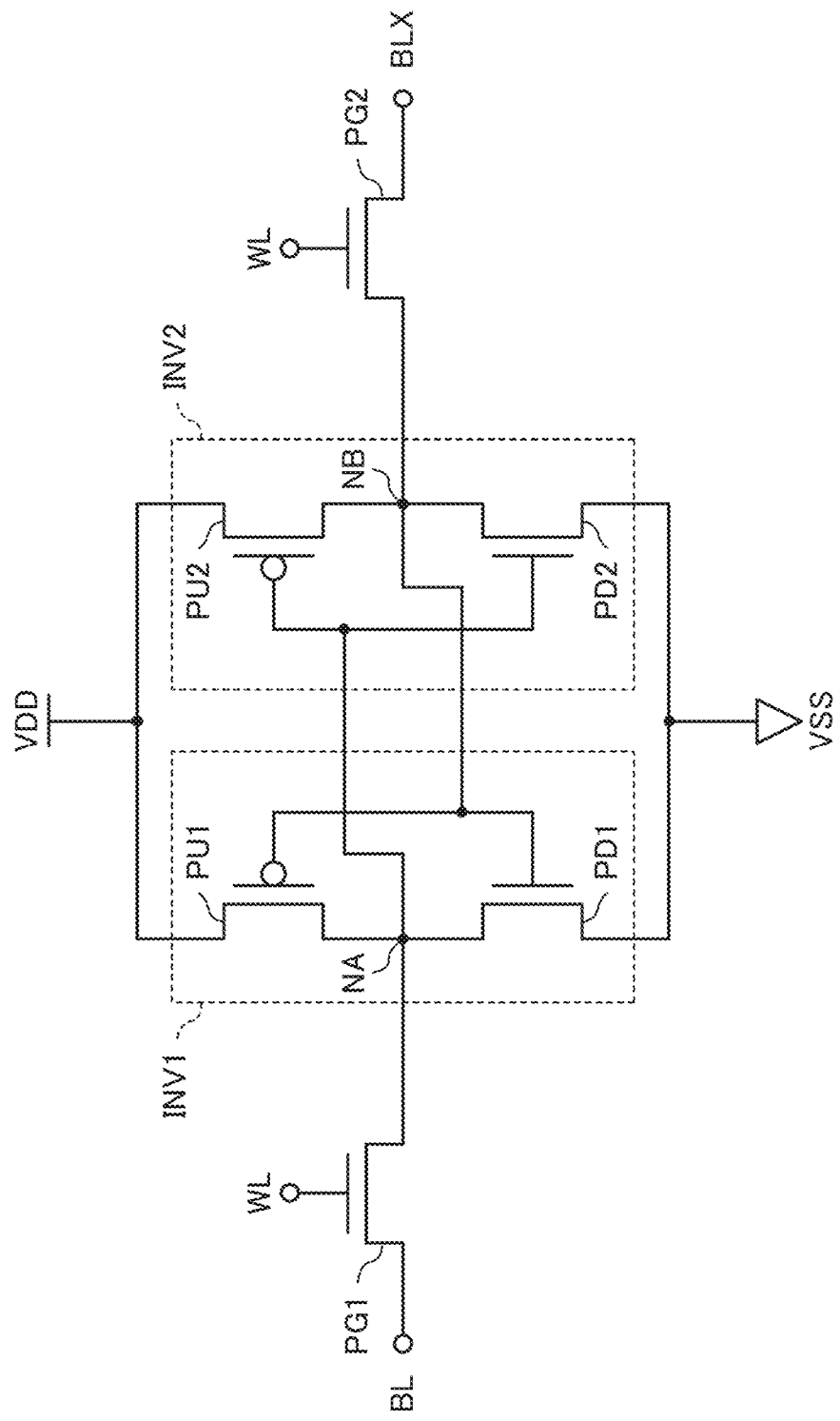
FIG. 5 is a circuit diagram of the SRAM cell of FIGS. 1A and 1B.

FIG. 5 is a circuit diagram of the SRAM cell according to the present embodiment. As shown in FIG. 5, in the SRAM cell according to the present embodiment, an SRAM circuit is configured with load transistors PU1 and PU2, drive transistors PD1 and PD2, and access transistors PG1 and PG2. The load transistors PU1 and PU2 are P-type FETs and the drive transistors PD1 and PD2 and the access transistors PG1 and PG2 are N-type FETs.

The load transistor PU1 is provided between the power supply VDD and the first node NA, and the drive transistor PD1 is provided between the first node NA and the power supply VSS. The load transistor PU1 and the drive transistor PD1, the gates of which are connected to the second node NB, constitute an inverter INV1. The load transistor PU2 is provided between the power supply VDD and the second node NB, and the drive transistor PD2 is provided between the second node NB and the power supply VSS. The load transistor PU2 and the drive transistor PD2, the gates of which are connected to the first node NA, constitute an inverter INV2. That is, the inverters INV1 and INV2, where the output of each one of them is connected to the input of the other, constitute a latch.

The access transistor PG1 is provided between the first bit line BL and the first node NA, and has a gate connected to the word line WL. The access transistor PG2 is provided between the second bit line BLX and the second node NB, and has a gate connected to the word line WL. The first and second bit lines BL and BLX constitute a complementary bit line pair.

In the SRAM cell circuit, when the first and second bit lines BL, BLX constituting the complementary bit line pair are driven to the high level and the low level, respectively, and the word line WL is driven to the high level, the high level is written to the first node NA, and the low level is written to the second node NB. On the other hand, when the first and second bit lines BL, BLX are driven to the low level and the high level, respectively, and the word line WL is driven to the high level, the low level is written to the first node NA, and the high level is written to the second node NB. When the word line WL is driven to the low level in a state in which data are written to the first and second nodes NA, NB, the latched state is determined, and the data written to the first and second nodes NA, NB are held.

When the first and second bit lines BL, BLX are precharged to the high level in advance and the word line WL is driven to the high level, the states of the first and second bit lines BL, BLX are determined in accordance with the data written in the first and second nodes NA, NB, so that data can be read from the SRAM cell. Specifically, when the first node NA is at a high level and the second node NB is at a low level, the first bit line BL holds the high level and the second bit line BLX is discharged to the low level. On the other hand, when the first node NA is low and the second node NB is high, the first bit line BL is discharged to the low level and the second bit line BLX holds the high level.

Thus, the SRAM cell according to the present embodiment performs data writing, data holding and data reading by controlling the first and second bit line BL, BLX and the word line WL.

In the layout structure of the present embodiment, the transistors PU1 and PU2 are formed in the upper part, the transistors PD1, PD2, PG1, and PG2 are formed in the lower part. Here, the transistors PU1, PU2, PD1, PD2, PG1, and PG2 are each composed of one nanowire FET. Note that the number of nanowire FETs constituting each transistor is determined in consideration of the operation stability and the like of the circuit.

As shown in FIG. 1B, power supply lines 11 and 12 extending in the Y direction are provided at both ends of the SRAM cell in the X direction. The power supply lines 11 and 12 are both buried power rails (BPRs) formed in a buried interconnect layer. The power supply lines 11 and 12 both supply VSS.

As shown in FIG. 1A, interconnects 61, 62, 63, 64, and 65 extending in the Y direction are formed in an M1 interconnect layer. The M1 interconnect 61 corresponds to the bit line BL, and the M1 interconnect 63 corresponds to the bit line BLX. The M1 interconnect 62 supplies VDD. An interconnect 71 extending in the X direction is formed in the M2 interconnect layer. The M2 interconnect 71 corresponds to the word line WL.

Nanowires 21a, 21b, 21c, and 21d extending in the Y direction are formed in the lower part of the SRAM cell, and nanowires 26a and 26b extending in the Y direction are formed in the upper part of the SRAM cell. The nanowires 21a and 26a overlap each other as viewed in plan, and the nanowires 21c and 26b overlap each other as viewed in plan.

Pads 22a, 22b, and 22c doped with an N-type semiconductor are formed at the upper side of the nanowire 21a, between the nanowires 21a and 21b, and at the lower side of the nanowire 21b in the figure, respectively. Pads 22d, 22e, and 22f doped with an N-type semiconductor are formed at the upper side of the nanowires 21c, between the nanowires 21c and 21d, and at the lower side of the nanowires 21d in the figure, respectively. Pads 27a, 27b, 27c, and 27d doped with a P-type semiconductor are formed at both sides of the nanowire 26a and at both sides of the nanowire 26b in the figure, respectively.

The nanowires 21a constitutes the channel portion of the transistor PD1, and the pads 22a and 22b constitute the nodes of the transistor PD1. The nanowires 21b constitutes the channel portion of the transistor PG1, and the pads 22b, 22c constitute the nodes of the transistor PG1. The pad 22b is shared by the transistor PD1 and PG1. The nanowires 21c constitutes the channel portion of the transistor PD2, and the pads 22d, 22e constitute the nodes of the transistor PD2. The nanowire 21d constitutes the channel portion of the transistor PG2, and the pads 22e and 22f constitute the nodes of the transistor PG2. The pad 22e is shared by the transistors PD2 and PG2.

The nanowire 26a constitutes the channel portion of the transistor PU1, and the pads 27a and 27b constitute the nodes of the transistor PU1. The nanowire 26b constitutes the channel portion of the transistor PU2, and the pads 27c and 27d constitute the nodes of the transistor PU2.

Gate interconnects 31a, 31b, and 31c extend in the X-direction in the lower part of the SRAM cell. The Gate interconnects 31a and 31b are arranged on the same straight line, and the gate interconnect 31c is arranged in parallel with the gate interconnect 31a and 31b. The gate interconnect 31a is to be a gate of the transistor PD1. That is, the nanowire 21a, the gate interconnect 31a, and the pads 22a and 22b constitute the transistor PD1. The gate interconnect 31b is to be a gate of the transistor PD2. That is, the nanowire 21c, the gate interconnect 31b, and the pads 22d and 22e constitute the transistor PD2. The gate interconnect 31c is to be a common gate of the transistors PG1 and PG2. That is, the nanowire 21b, the gate interconnect 31c, and the pads 22b and 22c constitute the transistor PG1, and the nanowire 21d, the gate interconnect 31c, and the pads 22e and 22f constitute the transistor PG2. The transistors PD1 and PD2 are aligned in the X direction, i.e., are formed at the same position in the Y direction. The transistors PG1, and PG2 are aligned in the X direction, i.e., are formed at the same position in the Y direction.

Gate interconnects 31d and 31e extend in the X-direction in the upper part of the SRAM cell. The gate interconnects 31d and 31e are arranged on the same straight line. The gate interconnects 31d and 31e overlap the gate interconnects 31a and 31b as viewed in plan, respectively. The gate interconnect 31d is to be a gate of the transistor PU1. That is, the nanowire 26a, the gate interconnect 31d, and pads 27a and 27b constitute the transistor PU1. The gate interconnect 31e is to be a gate of the transistor PU2. That is, the nanowire 26b, the gate interconnect 31e, and the pads 27c and 27d constitute the transistor PU2. The transistors PU1 and PU2 are aligned in the X direction, i.e., are formed at the same position in the Y direction. Then, the transistors PU1 and PU2 overlap the transistor PD1 and PD2 as viewed in plan, respectively.

In the lower part of the SRAM cell, local interconnects 41a, 41b, 41c, 41d, 41e, and 41f extending in the X direction are formed. The local interconnects 41a, 41b, 41c, 41d, 41e, and 41f are connected to the pads 22a, 22b, 22c, 22d, 22e, and 22f, respectively. In the upper part of the SRAM cell, local interconnects 43a, 43b, and 43c extending in the X direction are formed. The local interconnect 43a is connected to the pads 27a and 27c. The local interconnects 43b and 43c are connected to the pads 27b are 27d, respectively.

The local interconnect 41a is connected to the lower power supply line 11 through a contact 51a. The local interconnect 41b is connected to the upper local interconnect 43b through a contact 52a. The local interconnect 41c is connected to the upper M1 interconnect 61 through a contact 53a. The local interconnect 41d is connected to the lower power supply line 12 through a contact 51b. The local interconnect 41e is connected to the upper gate interconnect 31a through a shared contact 54a, and is connected to the upper local interconnect 43c through a contact 52b. The local interconnect 41f is connected to the upper M1 interconnect 63 through a contact 53b. The contacts 53a and 53b are formed at the same position in the Y direction.

The local interconnect 43a is connected to the upper M1 interconnect 62 through a contact 53c. The local interconnect 43b is connected to the lower local interconnect 41b through the contact 52a and is connected to the gate interconnect 31e through the shared contact 54b, as described above. The local interconnect 43c is connected to the lower local interconnect 41e through the contact 52b, as described above.

The gate interconnect 31a and the gate interconnect 31d are connected to each other through the shared contact 54a and the inter-gate contact 55a. The gate interconnect 31b and the gate interconnect 31e are connected to each other through the inter-gate contact 55b. The gate interconnect 31c is connected to the upper M1 interconnect 64 through the contact 56a, and is connected to the upper M1 interconnect 65 through the contact 56b.

M2 interconnect 71 is connected to the M1 interconnect 64 through the contact 57a, and is connected to the M1 interconnect 65 through the contact 57b.

As described above, according to the present embodiment, the SRAM cell includes the transistors PU1, PU2, PD1, PD2, PG1, and PG2. The transistors PU1, PU2, PD1, and PD2 are formed at the same position as each other in the Y-direction. The transistors PG1 and PG2 are formed at the same position as each other in the Y-direction. Thus, in the configuration in which a plurality of SRAM cells are arranged side by side in the Y direction, the contact 53a for connecting the respective SRAM cell and the M1 interconnect 61 serving as the bit line BL, and the contact 53b for connecting the respective SRAM cell and the M1 interconnect 63 serving as the bit line BLX, can be arranged at aligned positions in the Y direction. Therefore, since the load capacitance between the bit lines constituting the complementary bit line pair can be kept balanced, good characteristics can be realized for SRAM cells using CFETs.

Figure 6:
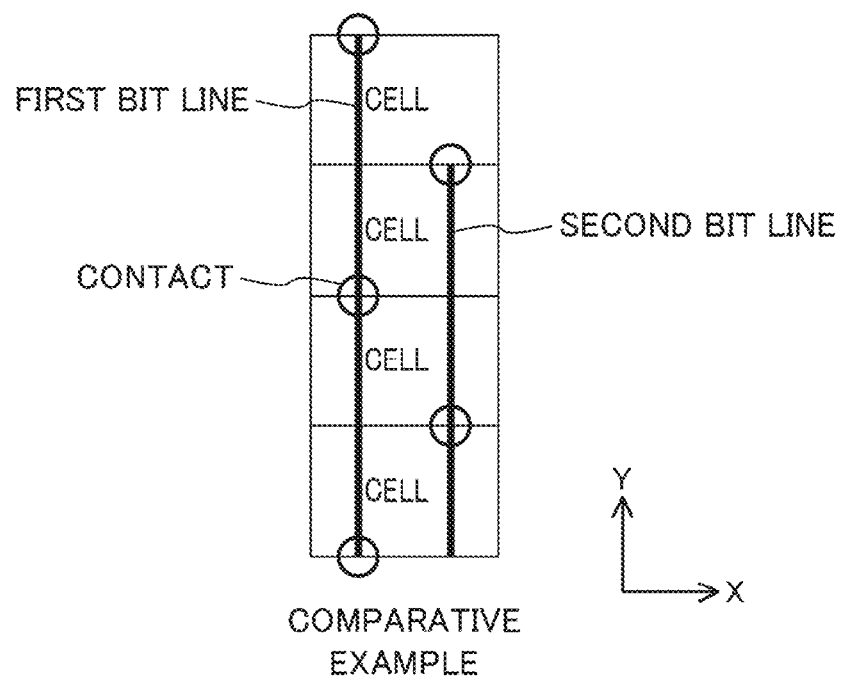
FIG. 6 is a figure schematically showing a comparison example.

FIG. 6 is a diagram schematically showing a comparative example. Memory cell arrays are typically constituted by arranging even numbers of memory cells in the bit line direction. In FIG. 6, the contacts connected to the first bit lines and the contacts connected to the second bit lines are arranged on the sides of the cell frame facing each other in the Y direction. In this configuration, since the number of contacts connected to the first bit line is different from the number of contacts connected to the second bit line, an imbalance in capacitance occurs between the bit lines constituting the complementary bit line pair. In data reading, a high-speed read operation is performed by amplifying a minute potential difference between bit lines by a sense amplifier circuit, but if there is an imbalance of capacitance between bit lines, it causes read speed degradation due to amplification timing delay and erroneous reading due to erroneous amplification of the sense amplifier.

On the other hand, in the present embodiment, in the SRAM cell, the contact connected to the first bit line and the contact connected to the second bit line are arranged at the same position in the Y direction. As a result, it is possible to suppress an imbalance in capacitance between the bit lines constituting the complementary bit line pair. Further, since SRAM cells adjoining in the bit line direction share contacts, the numbers of contacts connected to the first and second bit lines can be suppressed to N for 2 N SRAM cells arranged in the bit line direction, where N is a positive integer. Thus, since the load capacitance of the bit line is reduced, data writing is faster. Therefore, the read characteristic and the write characteristic of SRAM cell can be improved.

In the above embodiment, the transistors PU1, PU2, PD1, PD2, PG1, PG2 are assumed to be constituted by one nanowire FET, respectively, but the number of nanowire FETs constituting each transistor is not limited thereto. The number of nanowire FETs constituting each transistor may be determined by considering the operation stability of the circuit or the like. Further, if the numbers of nanowire FETs constituting the transistors PU1 and PU2 and the transistors PD1 and PD2 are different, the transistors PU1 and PU2 may overlap at least partially the transistors PD1 are PD2 as viewed in plan, respectively.

The shared contact may be formed in the same process step as the gate contact or the local interconnect, or may be formed in another process step.

Further, the power supply line 62 for supplying VDD is provided in the M1 interconnect layer, but power supply lines for supplying VDD may be provided in the buried interconnect layer. Further, power supply lines for supplying VDD may be provided in both the M1 interconnect layer and the buried interconnect layer. In this case, the power supply lines are strengthened and the power supply is stabilized.

Alteration

FIGS. 7A and 7B are views showing an example of a layout structure of an SRAM cell according to an alteration of the first embodiment, wherein FIG. 7A shows an upper part and FIG. 7B shows a lower part. In the present alteration, in contrast to the above-described embodiment, configurations of the upper part and the lower part are interchanged. That is, N-type nanowire FETs, i.e., transistors PD1, PD2, PG1, and PG2 are formed at the upper part and P-type nanowire FETs, i.e., transistors PU1 and PU2 are formed.

As shown in FIG. 7B, power supply lines 13 and 14 extending in the Y direction are provided at both ends in the X direction of the SRAM cell, respectively. The power supply lines 13 and 14 are both BPRs, and both supply VDD. As shown in FIG. 7A, M1 interconnect 66 for supplying VSS is formed in the M1 interconnect layer.

One node of the transistor PU1 is connected to the power supply line 13 through the local interconnect 45a and the contact 58a. One node of the transistor PU2 is connected to the power supply line 14 through the local interconnect 45b and the contact 58b. One nodes of the transistors PD1 and PD2 are commonly connected to the local interconnect 47a extending in the X direction. The local interconnect 47a is connected to the M1 interconnect 66 through the contact 59a. One node of the transistor PG1 is connected to the M1 interconnect 61 through the contact 59b. One node of the transistor PG2 is connected to the M1 interconnect 63 through the contact 59c. The contacts 59b and 59c are formed at the same position in the Y direction.

According to the present alteration, similar effects to those of the above-described embodiment can be obtained. That is, in the configuration in which a plurality of SRAM cells are arranged side by side in the Y direction, the contact 59b for connecting the respective SRAM cell and the M1 interconnect 61 serving as the bit line BL, and the contact 59c for connecting the respective SRAM cell and the M1 interconnect 63 serving as the bit line BLX, can be arranged at aligned positions in the Y direction. Therefore, since the load capacitance between the bit lines constituting the complementary bit line pair can be kept balanced, good characteristics can be realized for the SRAM cells using CFETs.

Second Embodiment

FIGS. 8A-8B are views showing an example of a layout structure of an SRAM cell according to the second embodiment, where FIG. 8A shows an upper part and FIG. 8B shows a lower part. In the present embodiment, P-type nanowire FETs and N-type nanowire FETs are disposed in the upper part, and N-type nanowire FETs are disposed in the lower part. Further, in the present embodiment, when arranging SRAM cells in arrays, SRAM cells adjoining in the X direction may be arranged as they are, or one of them may be arranged in an inverted manner with respect to the Y-axis. Further, SRAM cells adjoining in the Y direction are arranged by inverting one of them with respect to the X-axis.

Figure 9:
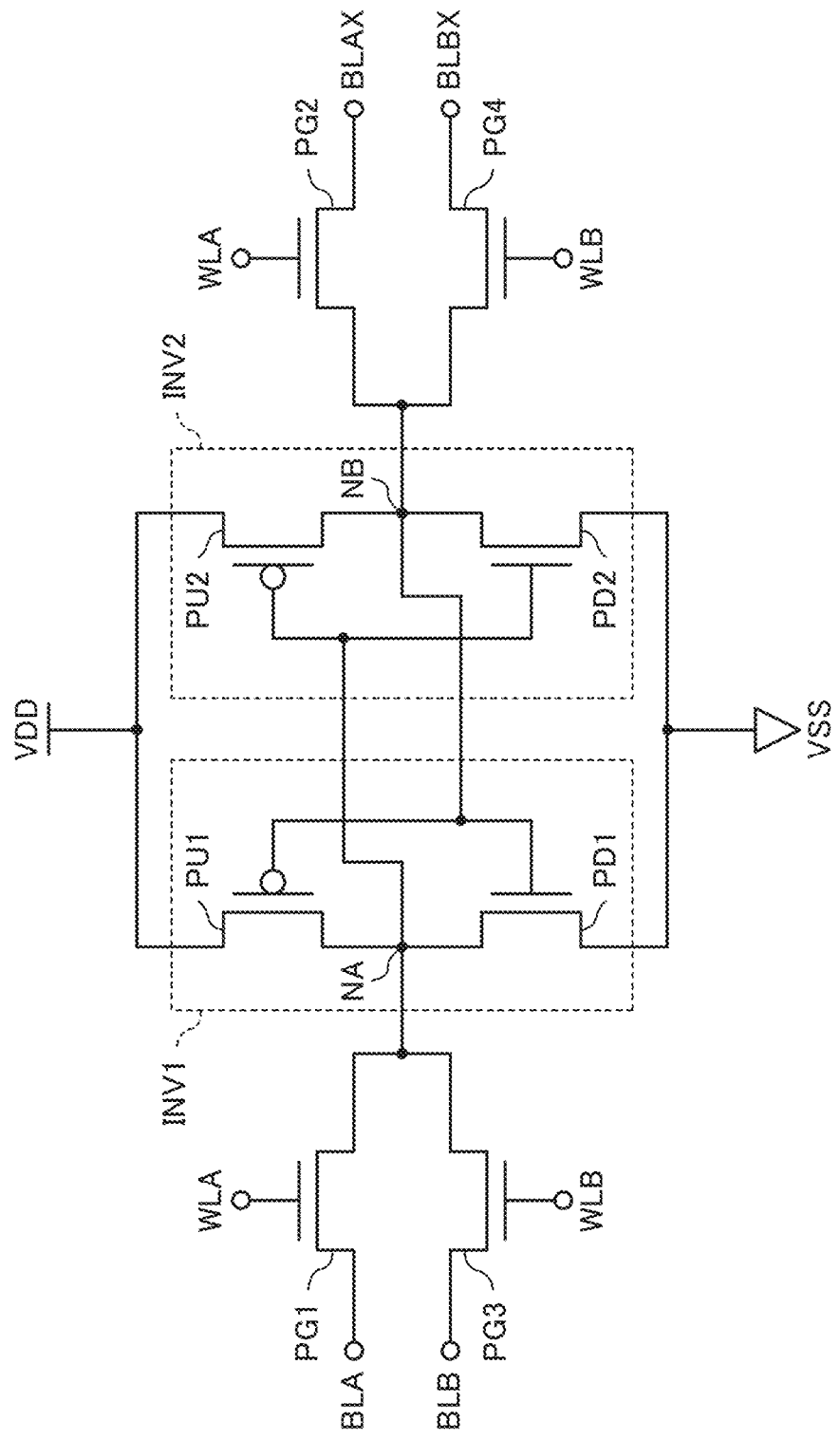
FIG. 9 is a circuit diagram of the SRAM cell of FIGS. 8A and 8B.

FIG. 9 is a circuit diagram of the SRAM cell according to the present embodiment. As shown in FIG. 9, in the SRAM cell according to the present embodiment, a two-port SRAM circuit is configured with load transistors PU1 and PU2, drive transistors PD1 and PD2, and access transistors PG1-PG4. The load transistors PU1 and PU2 are P-type FETs and the drive transistors PD1 and PD2 and access transistors PG1-PG4 are N-type FETs. As the configuration about the load transistors PU1 and PU2 and the drive transistors PD1 and PD2 is the same as the circuit of FIG. 5, a detailed description thereof will be omitted here.

The access transistor PG1 is provided between the first bit line BLA and the first node NA, and has a gate connected to the first word line WLA. The access transistor PG2 is provided between the second bit line BLAX and the second node NB, and has a gate connected to the first word line WLA. The access transistor PG3 is provided between the third bit line BLB and the first node NA, and has a gate connected to the second word line WLB. The access transistor PG4 is provided between the fourth bit line BLBX and the second node NB, and has a gate connected to the second word line WLB. The first and second bit lines BLA and BLAX constitute a first complementary bit line pair, and the third and fourth bit lines BLB and BLBX constitute a second complementary bit line pair.

In the two-port SRAM cell circuit, when the first and second bit lines BLA and BLAX constituting the first complementary bit line pair are driven to the high level and the low level, respectively, and the first word line WLA is driven to the high level, the high level is written to the first node NA, and the low level is written to the second node NB. On the other hand, when the first and second bit lines BLA and BLAX are driven to the low level and the high level, respectively, and the first word line WLA is driven to the high level, the low level is written to the first node NA, and the high level is written to the second node NB. When the first word line WLA is driven to the low level in a state in which data are written to the first and second nodes NA and NB, respectively, the latched state is determined, and the data written to the first and second nodes NA and NB are held.

When the first and second bit lines BLA and BLAX are precharged to a high level in advance and the first word line WLA is driven to a high level, the states of the first and second bit lines BLA are BLAX are determined in accordance with the data written in the first and second nodes NA and NB, so that data can be read from the SRAM cell. Specifically, when the first node NA is at a high level and the second node NB is at a low level, the first bit line BLA retains a high level and the second bit line BLAX is discharged to a low level. On the other hand, when the first node NA is at a low level and the second node NB is at a high level, the first bit line BLA is discharged to a low level and the second bit line BLAX holds a high level.

When the third and fourth bit lines BLB and BLBX constituting the second complementary bit line pair are driven to the high level and the low level, respectively, and the second word line WLB is driven to the high level, the high level is written to the first node NA, and the low level is written to the second node NB. On the other hand, when the third and fourth bit lines BLB and BLBX are driven to the low level and the high level, respectively, and the second word line WLB is driven to the high level, the low level is written to the first node NA, and the high level is written to the second node NB. When the second word line WLB is driven to the low level in a state in which data are written to the first and second nodes NA and NB, respectively, the latched state is determined, and the data written to the first and second nodes NA and NB are held.

When the third and fourth bit lines BLB and BLBX are precharged to a high level in advance and the second word line WLB is driven to a high level, the states of the third and fourth bit lines BLB and BLBX are determined in accordance with the data written in the first and second nodes NA and NB, so that data can be read from the SRAM cell. Specifically, when the first node NA is at a high level and the second node NB is at a low level, the third bit line BLB holds a high level and the fourth bit line BLBX is discharged to a low level. On the other hand, when the first node NA is at a low level and the second node NB is at a high level, the third bit line BLB is discharged to a low level and the fourth bit line BLBX holds a high level.

Thus, the two-port SRAM cell according to the present embodiment, by controlling the first and second bit lines BLA and BLAX and the first word line WLA, performs data writing, data holding and data reading. Further, the 2-port SRAM cell according to the present embodiment, by controlling the third and fourth bit lines BLB and BLBX and the second word line WLB performs data writing, data holding and data reading.

In the layout structure of the present embodiment, the transistors PU1, PU2, PG1, and PG2 are formed in the upper part, and the transistors PD1, PD2, PG3, and PG4 are formed in the lower part. The transistors PU1, PU2, PG1, PG2, PG3, and PG4 are each composed of one nanowire FET, and the transistors PD1 and PD2 are each composed of two nanowire FETs connected in parallel.

As shown in FIG. 8B, power supply lines 111, 112, and 113 extending in the Y direction are provided at both ends and the central portion in the X direction of the SRAM cell, respectively. The power supply lines 111, 112, 113 are BPR. The power supply lines 111 and 112 supply VSS, and the power supply line 113 supplies VDD.

As shown in FIG. 8A, interconnects 161, 162, 163, 164, 165, 166, and 167 extending in the Y direction are formed in the M1 interconnect layer. The M1 interconnect 161 corresponds to the bit line BLA, the M1 interconnect 162 corresponds to the bit line BLB, the M1 interconnect 163 corresponds to the bit line BLBX, the M1 interconnect 164 corresponds to the bit line BLAX. Interconnects 171 and 172 extending in the X direction are formed in the M2 interconnect layer. The M2 interconnect 171 corresponds to the word line WLA, and the M2 interconnect 172 corresponds to the word line WLB.

Nanowires 121a, 121b, 121c, 121d, 121e, and 121f extending in the Y direction are formed in the lower part of the SRAM cell and nanowires 126a, 126b, 126c, and 126d extending in the Y direction are formed in the upper part of the SRAM cell. The nanowires 121b and 126a overlap as viewed in plan, and the nanowires 121d and 126b overlap as viewed in plan.

Pads 122a, 122b, 122c, 122d, and 122e doped with an N-type semiconductor are formed on both sides of the nanowire 121a, at the upper side of the nanowire 121b, between the nanowires 121b and 121c, and at the lower side of the nanowire 121c in the figure, respectively. Pads 122f, 122g, 122h, 122i, and 122j doped with an N-type semiconductor are formed at the upper side of the nanowire 121d, between the nanowires 121d and 121e, at the lower side of the nanowire 121e, and on both sides of the nanowire 121f in the figure, respectively. Pads 127a, 127b, 127c, and 127d doped with a P-type semiconductor are formed on both sides of the nanowire 126a and on both sides of the nanowire 126b, respectively. Pads 127e, 127f, 127g, and 127h doped with an N-type semiconductor are formed on both sides of the nanowire 126c and on both sides of the nanowire 126d, respectively.

The nanowires 121a and 121b constitute the channel portions of the transistor PD1, and the pads 122a, 122b, 122c, and 122d constitute the nodes of the transistor PD1. The nanowire 121c constitutes the channel portion of the transistor PG3, and the pads 122d and 122e constitute the nodes of the transistor PG3. The pads 122d are shared by the transistors PD1 and PG3. The nanowires 121d and 121f constitute the channel portion of the transistor PD2, and the pads 122f, 122g, 122i, and 122j constitute the nodes of the transistor PD2. The nanowires 121e constitute the channel portion of the transistor PG4, and the pads 122g and 122h constitute the nodes of the transistor PG4. The pad 122g is shared by the transistors PD2 and PG4.

The nanowire 126a constitute the channel portion of the transistor PU1, and the pads 127a and 127b constitute the nodes of the transistor PU1. The nanowire 126b constitutes the channel portion of the transistor PU2, and the pads 127c and 127d constitute the nodes of the transistor PU2. The nanowire 126c constitutes the channel portion of the transistor PG1, and the pads 127e and 127f constitute the nodes of the transistor PG1. The nanowire 126d constitutes the channel portion of the transistor PG2, and the pads 127g and 127h constitute the nodes of the transistor PG2.

In the lower part of the SRAM cell, gate interconnects 131a, 131b, 131c extend in the X direction. The gate interconnects 131a and 131b are arranged on the same straight line, and the gate interconnect 131c are arranged in parallel with the gate interconnects 131a and 131b. The gate interconnect 131a is to be the gate of the transistor PD1. That is, the nanowires 121a and 121b, the gate interconnect 131a, and the pads 122a, 122b, 122c, and 122d constitute the transistor PD1. Gate interconnect 131b is to be the gate of the transistor PD2. That is, the nanowires 121d and 121f, the gate interconnect 131b, and the pads 122f, 122g, 122i, and 122j constitute the transistor PD2. The gate interconnect 131c is to be the common gate of the transistor PG3 and PG4. That is, the nanowire 121c, the gate interconnect 131c, and the pads 122d and 122e constitute the transistor PG3, and the nanowire 121e, the gate interconnect 131c, and the pads 122g and 122h constitute the transistor PG4.

In the upper part of the SRAM cell, gate interconnects 131d, 131e, 131f, and 131g extend in the X-direction. The gate interconnects 131d and 131e are arranged on the same straight line. The gate interconnects 131f and 131g are arranged on the same straight line. The gate interconnects 131d and 131e overlap the gate interconnects 131a and 131b as viewed in plan, respectively. The gate interconnect 131d is to be the gate of the transistor PU1. That is, the nanowire 126a, the gate interconnect 131d, and the pads 127a and 127b constitute the transistor PU1. The gate interconnect 131e is to be the gate of the transistor PU2. That is, the nanowire 126b, the gate interconnect 131e, and the pads 127c and 127d constitute the transistor PU2. The gate interconnect 131f is to be the gate of the transistor PG1. That is, the nanowire 126c, the gate interconnect 131f, and the pads 127e and 127f constitute the transistor PG1. The gate interconnect 131g is to be the gate of the transistor PG2. That is, the nanowire 126d, the gate interconnect 131g, and the pads 127g and 127h constitute the transistor PG2.

In the lower part of the SRAM cell, local interconnects 141a, 141b, 141c, 141d, 141e, and 141f extending in the X-direction are formed. The local interconnect 141a is connected to the pads 122a and 122c, the local interconnect 141b is connected to the pads 122b and 122d, and the local interconnect 141c is connected to the pad 122e. The local interconnect 141d is connected to the pads 122f and 122i, the local interconnect 141e is connected to the pads 122g and 122j, and the local interconnect 141f is connected to the pad 122h.

In the upper part of the SRAM cell, local interconnects 143a, 143b, 143c, 143d, and 143e extending in the X direction are formed. The local interconnect 143a is connected to the pads 127a and 127c, the local interconnect 143b is connected to the pads 127e and 127b, and the local interconnect 143c is connected to the pad 127f. The local interconnect 143d is connected to the pads 127d and 127g, and the local interconnect 143e is connected to the pad 127h.

The local interconnect 141a is connected to the lower power supply line 111 through a contact 151a. The local interconnect 141b is connected to the upper local interconnect 143b through a contact 152a. The local interconnect 141c is connected to an upper M1 interconnect 162 through a contact 153a. The local interconnect 141d is connected to the lower power supply line 112 through a contact 151b. The local interconnect 141e is connected to the gate interconnect 131a through a shared contact 154a, and is connected to the upper local interconnect 143d through a contact 152b. The local interconnect 141f is connected to an upper M1 interconnect 163 through a contact 153b. The contacts 153a and 153b are formed at the same position in the Y direction as each other.

The local interconnect 143a is connected to the lower power supply line 113 through a contact 151c. As described above, the local interconnect 143b is connected to the lower local interconnect 141b through the contact 152a, and is connected to the gate interconnect 131e through the shared contact 154b. The local interconnect 143c is connected to the upper M1 interconnect 161 through a contact 153c. As described above, the local interconnect 143d is connected to the lower local interconnect 141e through the contact 152b. The local interconnect 143e is connected to an upper M1 interconnect 164 through a contact 153d. The contacts 153c and 153d are formed at the same position in the Y direction as each other.

The gate interconnect 131a and the gate interconnect 131d are connected to each other through a shared contact 154a and an inter-gate contact 155a. The gate interconnect 131b and the gate interconnect 131e are connected to each other through an inter-gate contact 155b. The gate interconnect 131f is connected to the M1 interconnect 165 through the contact 156a, and the gate interconnect 131g is connected to the M1 interconnect 167 through the contact 156b. The gate interconnect 131c is connected to the M1 interconnect 166 through the contact 156c.

The M2 interconnect 171 is connected to the M1 interconnect 165 through the contact 157a, and is connected to the M1 interconnect 167 through the contact 157b. The M2 interconnect 172 is connected to the M1 interconnect 166 through the contact 157c.

As described above, according to the present embodiment, the SRAM cell includes the transistors PU1, PU2, PD1, PD2, PG1, PG2, PG3, and PG4. The transistors PU1, PU2, PD1, and PD2 are formed at the same position in the Y direction as each other. The transistors PG1, PG2, PG3, and PG4 are formed at the same position in the Y-direction as each other. Thus, in a configuration in which a plurality of SRAM cells are arranged side by side in the Y direction, the contact 153c connecting each SRAM cell to the M1 interconnect 161 serving as the bit line BLA and the contact 153d connecting each SRAM cell to the M1 interconnect 164 serving as the bit line BLAX can be arranged in alignment with each other in the Y direction. And the contact 153a connecting each SRAM cell to the M1 interconnect 162 serving as the bit line BLB and the contact 153b connecting each SRAM cell to the M1 interconnect 163 serving as the bit line BLBX can be arranged in alignment with each other in the Y direction. Therefore, since the load capacitance between the bit lines constituting the complementary bit line pair can be kept balanced, good characteristics can be realized for SRAM cells using CFETs.

Although illustration is omitted, in this embodiment as well, it is possible to replace the configurations of the upper part and the lower part as in the alteration of the first embodiment. That is, as a layout structure, the transistors PD1, PD2, PG3, and PG4 may be formed in the upper part and the transistors PU1, PU2, PG1, and PG2 may be formed in the lower part.

In the above-described embodiment, each of the transistors PU1, PU2, PG1, PG2, PG3, and PG4 is constituted by one nanowire FET, and each of the transistors PD1 and PD2 is constituted by two nanowire FETs connected in parallel. But the number of nanowire FETs constituting each transistor is not limited thereto. The number of nanowire FETs constituting each transistor may be determined by considering the operation stability of the circuit or the like.

Third Embodiment

FIGS. 10A-10B are views showing an example of a layout structure of an SRAM cell according to the third embodiment, where FIG. 10A shows an upper part and FIG. 10B shows a lower part. In the present embodiment, P-type nanowire FETs and N-type nanowire FETs are disposed in the upper part, and N-type nanowire FETs are disposed in the lower part. In the present embodiment, when SRAM cells are arranged in an array, SRAM cells neighboring in the X direction are arranged with one inverted with respect to the Y axis. Further, SRAM cells neighboring in the Y direction are arranged with one inverted with respect to the X-axis.

Figure 11:
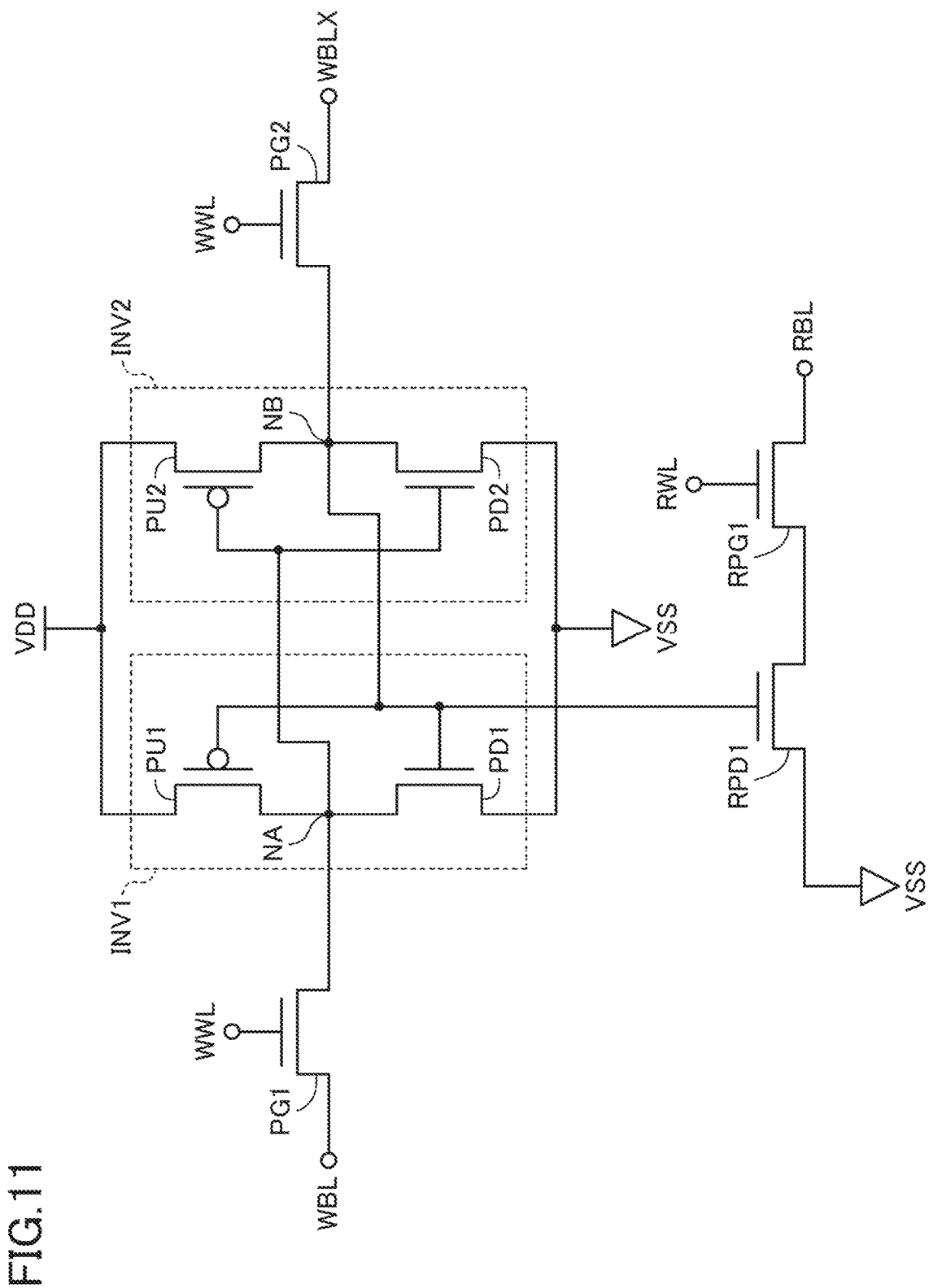
FIG. 11 is a circuit diagram of the SRAM cell of FIGS. 10A and 10B.

FIG. 11 is a circuit diagram of a SRAM cell according to the present embodiment. As shown in FIG. 11, in the SRAM cell, a two-port SRAM circuit is configured by load transistors PU1 and PU2, drive transistors PD1 and PD2, access transistors PG1 and PG2, a read drive transistor RPD1, and a read access transistor RPG1. The load transistors PU1 and PU2 are P-type FETs, and the drive transistors PD1 and PD2, the access transistors PG1 and PG2, the read drive transistor RPD1 and the read access transistor RPG1 are N-type FETs. As the configuration about the load transistors PU1 and PU2 and the drive transistors PD1 and PD2 is the same as the circuit of FIG. 5, a detailed description thereof will be omitted here.

The access transistor PG1 is provided between the write bit line WBL and the first node NA, and the gate is connected to the write word line WWL. The access transistor PG2 is provided between the write bit line WBLX and the second node NB, and the gate is connected to the write word line WWL. The write bit lines WBL and WBLX constitute a complementary write bit line pair.

The read drive transistor RPD1 has a source connected to the power supply VSS, a gate connected to the second node NB, and a drain connected to the source of the read access transistor RPG1. The read access transistor RPG1 has a gate connected to the read word line RWL and a drain connected to the read bit line RBL.

In the two-port SRAM circuit, when the write bit lines WBL and WBLX constituting the complementary write bit line pair are driven to the high level and the low level, respectively, and the write word line WWL is driven to the high level, the high level is written to the first node NA, and the low level is written to the second node NB. On the other hand, when the write bit lines WBL and WBLX are driven to the low level and the high level, respectively, and the write word line WWL is driven to the high level, the low level is written to the first node NA, and the high level is written to the second node NB. When the write word line WWL is driven to the low level in a state in which data are written to the first and second nodes NA are NB, respectively, the latched state is determined, and the data written to the first and second nodes NA and NB are held.

When the read bit line RBL is precharged to a high level in advance and the read word line RWL is driven to a high level, the state of the read bit line RBL is fixed in accordance with the data written in the second node NB, so that data can be read from the SRAM cell. Specifically, when the second node NB is at the high level, the read bit line RBL is discharged to the low level. On the other hand, when the second node NB is at the low level, the read bit line RBL holds the high level.

As described above, the two-port SRAM cell according to the present embodiment performs data writing, data holding, and data reading by controlling the write bit lines WBL and WBLX, the read bit line RBL, the write word line WWL and the read word line RWL.

In the layout structure of the present embodiment, the transistors PU1 and PU2 are formed in the upper part, and the transistors PD1, PD2, PG1, and PG2 are formed in the lower part. Each of the transistors PU1, PU2, PD1, PD2, PG1, and PG2 consists of one nanowire transistor. Each of the transistors RPD1 and RPG1 is composed of two nanowire FETs connected in parallel and formed in the upper and lower parts, respectively.

As shown in FIG. 10B, the power supply lines 211, 212, and 213 extending in the Y direction are provided. Each of the power supply lines 211, 212, and 213 is BPR. Power supply line 211 and 213 supply VSS, and the power supply line 212 supplies VDD.

As shown in FIG. 10A, interconnects 261, 262, 263, 264, and 265 extending in the Y direction are formed in the M1 interconnect layer. M1 interconnect 261 corresponds to the write bit line WBL, M1 interconnect 262 corresponds to the write bit line WBLX, M1 interconnect 263 corresponds to the read bit line RBL. Interconnects 271, and 272 extending in the X direction are formed in the M2 interconnect layer. M2 interconnect 271 corresponds to the read word line RWL, and M2 interconnect 272 corresponds to the write word line WWL.

In the lower part of the SRAM cell, nanowires 221a, 221b, 221c, 221d, 221e, and 221f extending in the Y direction are formed, and in the upper part of the SRAM cell, nanowires 226a, 226b, 226c, and 226d extending in the Y direction are formed. The nanowires 221a and 226a overlap as viewed in plan, the nanowires 221c and 226b overlap as viewed in plan, the nanowires 221e and 226c overlap as viewed in plan, and the nanowires 221f and 226d overlap as viewed in plan.

Pads 222a, 222b, and 222c doped with an N-type semiconductor are formed at the upper side of the nanowire 221a, between the nanowires 221a and 221b, and at the lower side of the nanowire 221b in the figure, respectively. Pads 222d, 222e, and 222f doped with an N-type semiconductor are formed at the upper side of the nanowires 221c, between the nanowires 221c and 221d, and at the lower side of the nanowires 221d in the figure, respectively. Pads 222g, 222h, and 222i doped with an N-type semiconductor are formed at the upper side of the nanowires 221e, between the nanowires 221e, 221f, and at the lower side of the nanowires 221f in the figure, respectively.

Pads 227a, 227b, 227c, and 227d doped with a P-type semiconductor are formed at both sides of the nanowire 226a and at both sides of the nanowire 226b, respectively. Pads 227e, 227f, and 227g doped with an N-type semiconductor are formed at the upper side of the nanowire 226c, between the nanowires 226c and 226d, and at the lower side of the nanowire 226d in the figure, respectively.

The nanowire 221a constitutes the channel portion of the transistor PD1, and the pads 222a and 222b constitute nodes of the transistor PD1. Nanowire 221b constitutes the channel portion of the transistor PG1, and pads 222b and 222c constitute the nodes of the transistor PG1. Pad 222b is shared with the transistors PD1 and PG1. The nanowire 221c constitutes the channel portion of the transistor PD2, and the pads 222d and 222e constitute the nodes of the transistor PD2. The nanowire 221d constitutes the channel portion of the transistor PG2, and the pads 222e and 222f constitute the nodes of the transistor PG2. The pad 222e is shared by the transistors PD2 and PG2.

The nanowire 226a constitutes the channel portion of the transistor PU1, and the pads 227a and 227b constitute the nodes of the transistor PU1. The nanowire 226b constitutes the channel portion of the transistor PU2, and the pads 227c and 227d constitute the nodes of the transistor PU2.

The nanowires 221e and 226c constitute the channel portion of the transistor RPD1, and the pads 222g, 222h, 227e, and 227f constitute the nodes of the transistor RPD1. The nanowires 221f and 226d constitute the channel portion of the transistor RPG1, and the pads 222h, 222i, 227f, and 227g constitute the nodes of the transistor RPG1. The pads 222h and 227f are shared by the transistors RPD1 and RPG1.

In the lower part of the SRAM cell, gate interconnects 231a, 231b, 231c, and 231d extend in the X-direction. The gate interconnects 231a and 231b are arranged on the same straight line, and the gate interconnects 231c and 231d are arranged on the same straight line. The gate interconnects 231c and 231d are arranged in parallel with the gate interconnects 231a and 231b. The gate interconnect 231a is to be a gate of the transistor PD1. That is, the nanowire 221a, the gate interconnect 231a, and the pads 222a and 222b constitute the transistor PD1. Gate interconnect 231b is to be a common gate of the transistors PD2, and RPD1. That is, the nanowire 221c, the gate interconnect 231b, and the pads 222d and 222e constitute the transistor PD2, and the nanowire 221e, the gate interconnect 231b, and the pads 222g and 222h constitute a lower transistor of the transistor RPD1. The gate interconnect 231c is to be a common gate of the transistor PG1 and PG2. That is, the nanowire 221b, the gate interconnect 231c, and the pads 222b and 222c constitute the transistor PG1, and the nanowire 221d, the gate interconnect 231c, and the pads 222e and 222f constitute the transistor PG2. The gate interconnect 231d is to be a gate of the transistor RPG1. That is, the nanowire 221f, the gate interconnect 231d, and the pads 222h and 222i constitute a lower transistor of the transistor RPG1.

In the upper part of the SRAM cell, gate interconnects 231e, 231f, and 231g extend in the X direction. The gate interconnects 231e and 231f are arranged on the same straight line, and the gate interconnect 231g are arranged in parallel with the gate interconnects 231e and 231f. The gate interconnects 231e, 231f, and 231g overlap with the gate interconnects 231a, 231b, and 231d, respectively, as viewed in plan. The gate interconnect 231e is to be a gate of the transistor PU1. That is, the nanowire 226a, the gate interconnect 231e, and the pads 227a and 227b constitute the transistor PU1. The gate interconnect 231f is to be a common gate of the transistors PU2 and RPD1. That is, the nanowire 226b, the gate interconnect 231f, and the pads 227c and 227d constitute the transistor PU2, and the nanowire 226c, the gate interconnect 231f, and the pads 227e and 227f constitute an upper transistor of the transistor RPD1. The gate interconnect 231g is to be a gate of the transistor RPG1. That is, the nanowire 226d, the gate interconnect 231g, and the pads 227f and 227g constitute an upper transistor of the transistor RPG1.

In the lower part of the SRAM cell, local interconnects 241a, 241b, 241c, 241d, 241e, 241f, 241g, and 241h extending in the X direction are formed. The local interconnect 241d is connected to the pads 222d and 222g. The local interconnects 241a, 241b, 241c, 241e, 241f, 241g, and 241h are connected to the pads 222a, 222b, 222c, 222e, 222f, 222h, and 222i, respectively. In the upper part of the SRAM cell, local interconnects 243a, 243b, 243c, 243d, and 243e extending in the X direction are formed. The local interconnect 243a is connected to the pads 227a and 227c. The local interconnects 243b, 243c, 243d, and 243e are connected to the pads 227b, 227d, 227e, and 227f, respectively.

The local interconnect 241a is connected to the lower power supply line 211 through a contact 251a. The local interconnect 241b is connected to the upper local interconnect 243b through a contact 252a. The local interconnect 241c is connected to an upper M1 interconnect 261 through a contact 253a. The local interconnect 241d is connected to the lower power supply line 213 through a contact 251b, and is connected to the upper local interconnect 243d through a contact 252b. The local interconnect 241e is connected to the gate interconnect 231a through a shared contact 254a, and is connected to the upper local interconnect 243c through a contact 252c. The local interconnect 241f is connected to an upper M1 interconnect 262 through a contact 253b. The local interconnect 241g is connected to the upper local interconnect 243e through a contact 252d. The local interconnect 241h is connected to an upper M1 interconnect 263 through a contact 253c. The contacts 253a and 253b are formed at the same position in the Y direction.

The local interconnect 243a is connected to the lower power supply line 212 through a contact 251c. As described above, the local interconnect 243b is connected to the lower local interconnect 241b through the contact 252a, and is connected to the gate interconnect 231f through the shared contact 254b. As described above, the local interconnect 243c is connected to the lower local interconnect 241e through the contact 252c. As described above, the local interconnect 243d is connected to the lower local interconnect 241d through the contact 252b. As described above, the local interconnect 243e is connected to the lower local interconnect 241g through the contact 252d.

The gate interconnect 231a and the gate interconnect 231e are connected to each other through a shared contact 254a and an inter-gate contact 255a. The gate interconnect 231b and the gate interconnect 231f are connected to each other through an inter-gate contact 255b. The gate interconnect 231d and the gate interconnect 231g are connected to each other through an inter-gate contact 255c. The gate interconnect 231c is connected to the M1 interconnect 265 through a contact 256a. The gate interconnect 231g is connected to the M1 interconnect 264 through a contact 256b.

The M2 interconnect 271 is connected to the M1 interconnect 264 through the contact 257a. M2 interconnect 272 is connected to the M1 interconnect 265 through the contact 257b.

As described above, according to the present embodiment, the SRAM cell includes the transistors PU1, PU2, PD1, PD2, PG1, PG2, RPD1, and RPG1. The transistors PU1, PU2, PD1, and PD2 are formed at the same position in the Y direction as each other. The transistors PG1 and PG2 are formed at the same position in the Y direction as each other. Thus, in a configuration in which a plurality of SRAM cells are arranged side by side in the Y direction, the contact 253a connecting each SRAM cell to the M1 interconnect 261 serving as the write bit line WBL and the contact 253b connecting each SRAM cell to the M1 interconnect 262 serving as the write bit line WBLX can be arranged in alignment in the Y direction. Therefore, since the load capacitance between the bit lines constituting the complementary bit line pair can be kept balanced, good characteristics can be realized for SRAM cells using CFETs.

In the above embodiment, each of the transistors PU1, PU2, PD1, PD2, PG1, and PG2 is constituted by one nanowire FET, and each of the transistors RPD1 and RPG1 is constituted by two nanowire FETs. But the number of nanowire FETs constituting each transistor is not limited thereto. The number of nanowire FETs constituting each transistor may be determined by considering the operation stability of the circuit or the like.

Although the power supply lines 211 and 213 for supplying VSS are BPR, power supply lines for supplying VSS may be provided in the M1 interconnect layer. And power supply lines for supplying VSS may be provided in both the M1 interconnect layer and the buried interconnect layer. In this case, the power supply lines are strengthened and the power supply is stabilized.

Alternation

FIGS. 12A-12B are views showing an example of a layout structure of an SRAM cell according to an alteration of the third embodiment, where FIG. 12A shows an upper part and FIG. 12B shows a lower part. In this alteration, in contrast to the embodiments described above, transistors RPD2 and RPG2 has been added.

Figure 13:
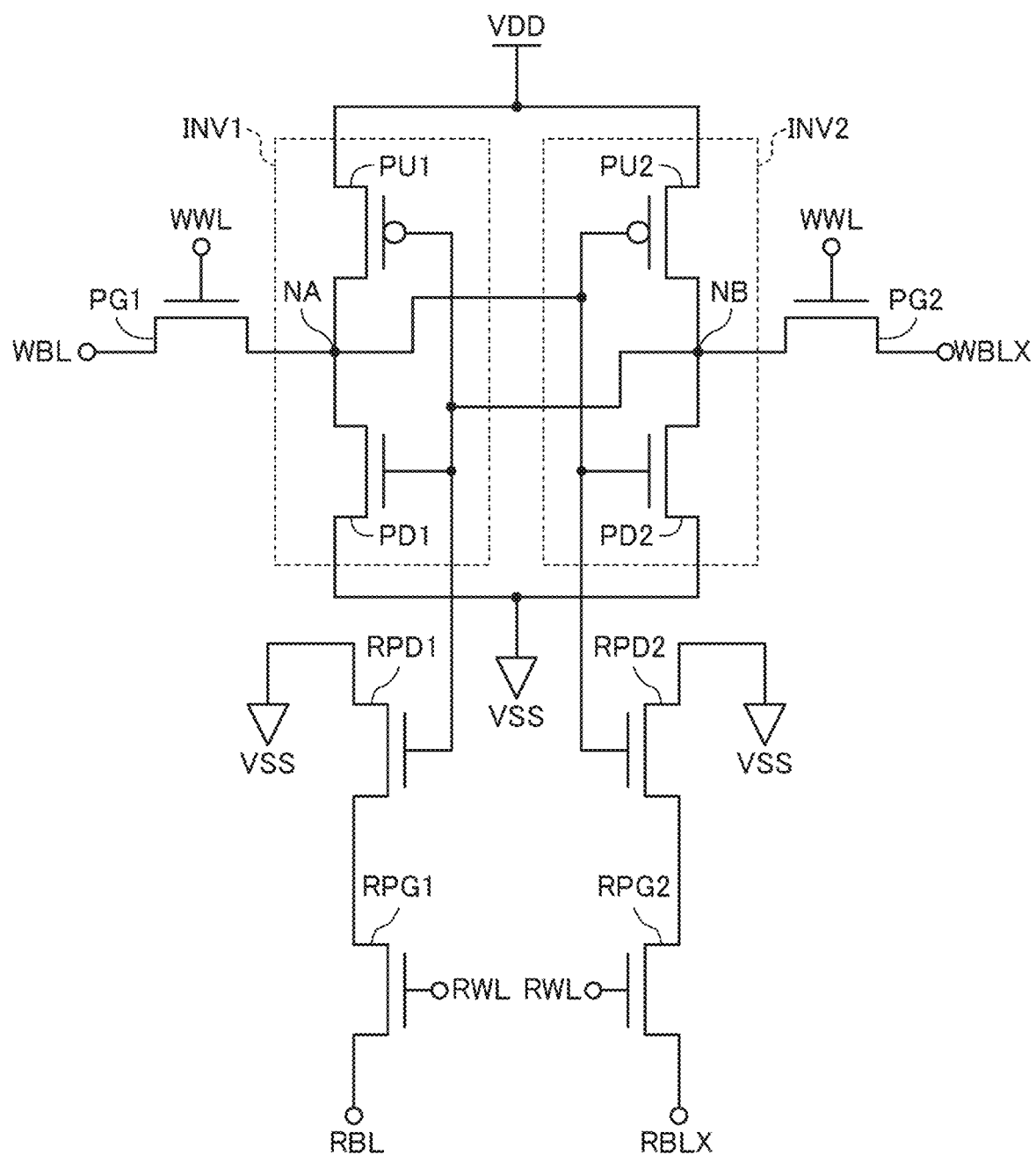
FIG. 13 is a circuit diagram of the SRAM cell of FIGS. 12A and 12B.

FIG. 13 is a circuit diagram of the SRAM cell according to the present alteration. The circuit of FIG. 13 is the circuit where a read port is a complementary output in the circuit of FIG. 11. Specifically, a read bit line RBLX forming a complementary read bit line pair with the read bit line RBL is provided, and a read drive transistor RPD2 and a read access transistor RPG2 are added. The read drive transistor RPD2 has a source connected to the power supply VSS, a gate connected to the first node NA, and a drain connected to the source of the read access transistor RPG2. The read access transistor RPG2 has a gate connected to the read word line RWL and a drain connected to the read bit line RBLX.

In the layout structure of this alteration, the transistors PU1 and PU2 are formed in the upper part, and the transistors PD1, PD2, PG1, PG2 are formed in the lower part. Each of the transistors PU1, PU2, PD1, PD2, PG1, and PG2 consists of one nanowire transistor. Each of the transistors RPD1, RPD2, RPG1, and RPG2 is composed of two nanowire FETs connected in parallel and formed in the upper and lower parts, respectively.

Figure 10:
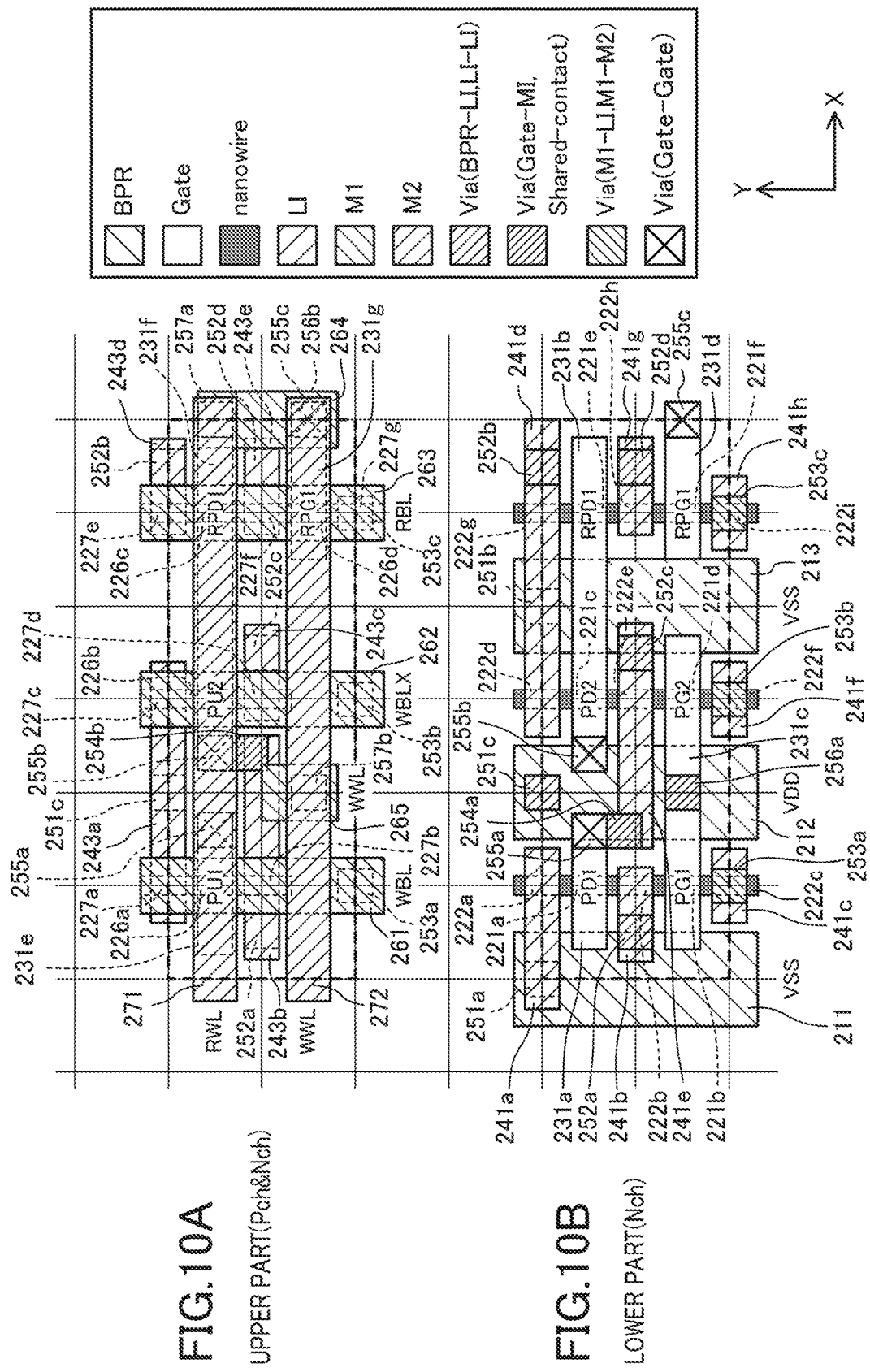
FIGS. 10A and 10B are plan views showing an example of a layout structure of an SRAM cell according to the third embodiment.
Figure 12:
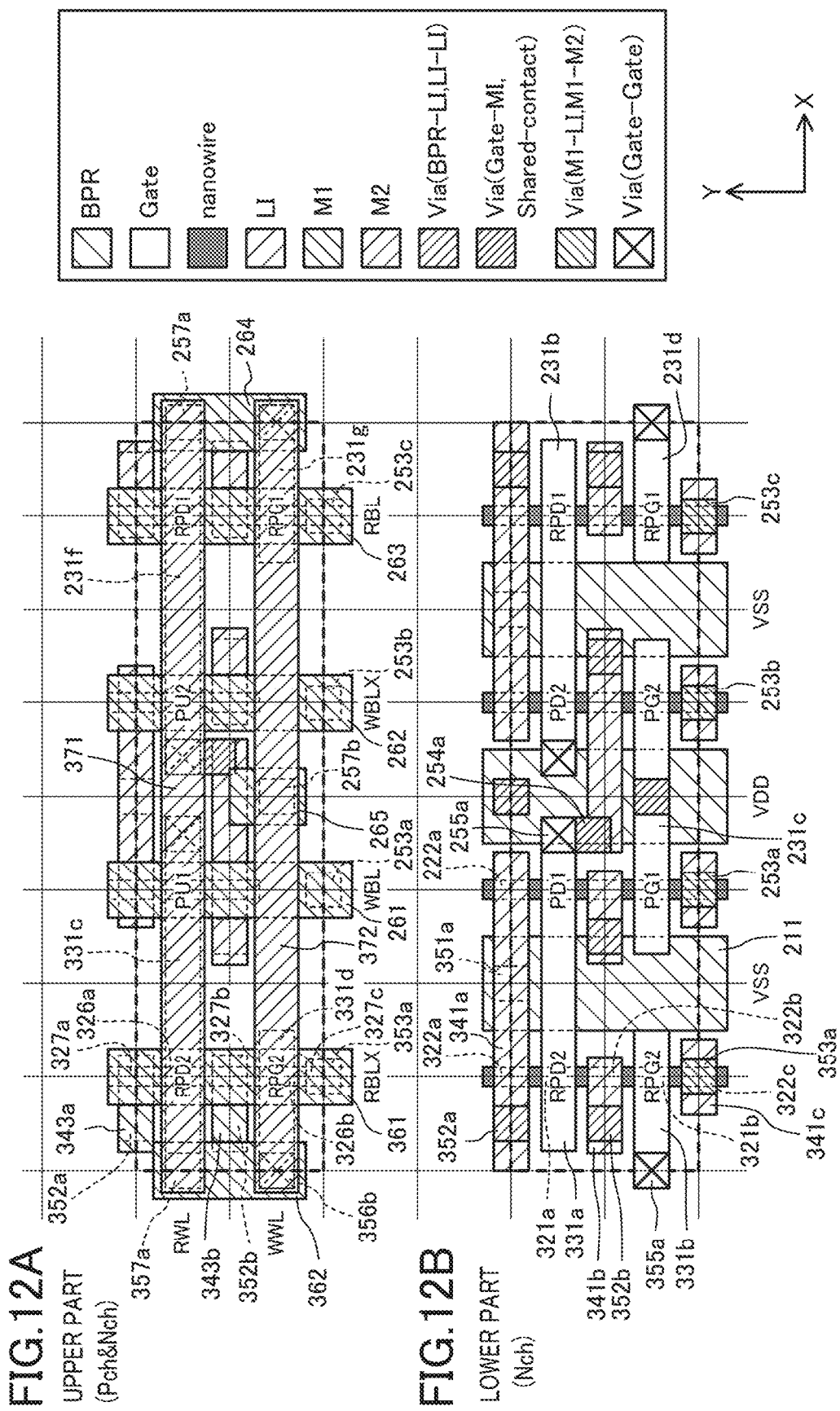
FIGS. 12A and 12B are plan views showing a layout structure of an SRAM cell according to an alternation of the third embodiment.

As can be seen by comparing FIG. 12 with FIG. 10, in the present alteration, the configuration about the transistors PU1, PU2, PD1, PD2, PG1, PG2, RPD1, and RPG1 is the same as the above-described embodiment. In this alteration, at the left portion in the figure of the SRAM cell, transistors RPD2 and RPG2 are formed. Here, the portion different from the above embodiment will be mainly described.

As shown in FIG. 12A, interconnects 361 and 362 extending in the Y direction are formed in the M1 interconnect layer. The M1 interconnect 361 corresponds to the read bit line RBLX. Interconnects 371 and 372 extending in the X direction are formed in the M2 interconnect layer. The M2 interconnect 371 corresponds to the read word line RWL, and the M2 interconnect 372 corresponds to the write word line WWL.

Nanowires 321a and 321b extending in the Y direction are formed in the lower part of the SRAM cell, and nanowires 326a and 326b extending in the Y direction are formed in the upper part of the SRAM cell. The nanowires 321a and 326a overlap as viewed in plan, and the nanowires 321b and 326b overlap as viewed in plan.

Pads 322a, 322b, and 322c doped with an N-type semiconductor are formed at the upper side of the nanowire 321a, between the nanowires 321a and 321b, and at the lower side of the nanowire 321b in the figure, respectively. Pads 327a, 327b, and 327c doped with an N-type semiconductor are formed at the upper side of the nanowire 326a, between the nanowires 326a and 326b, and at the lower side of the nanowire 326b in the figure, respectively.

The nanowires 321a and 326a constitute the channel portion of the transistor RPD2, and the pads 322a, 322b, 327a, and 327b constitute the nodes of the transistor RPD2. Nanowires 321b, 326b constitute the channel portion of the transistor RPG2, and pads 322b, 322c, 327b, and 327c constitute the nodes of the transistor RPG2. The pads 322b and 327b are shared with the transistors RPD2 and RPG2.

In the lower part of the SRAM cell, gate interconnects 331a and 331b extend in the X direction. The gate interconnects 331a and 231b are arranged on the same straight line, and the gate interconnects 331b, 231c, and 231d are arranged on the same straight line. The gate interconnect 331a is to be a gate of the transistor RPD2 and PD1. That is, the nanowire 321a, the gate interconnect 331a, and the pads 322a and 322b constitute the lower transistor of the transistor RPD2. Gate wire 331b is to be a gate of the transistor RPG2. That is, the nanowire 321b, the gate interconnect 331b, and pads 322b and 322c constitute the lower transistor of the transistor RPG2.

In the upper part of the SRAM cell, gate interconnects 331c and 331d extend in the X direction. The gate interconnects 331c and 231f are arranged on the same straight line, and the gate interconnects 331d and 231g are arranged on the same straight line. The gate interconnect 331c is to be gates of the transistors RPD2 and PU1. That is, the nanowire 326a, the gate interconnect 331c, and the pads 327a and 327b constitute the upper transistor of the transistor RPD2. The gate interconnect 331d is to be a gate of the transistor RPG2. That is, the nanowire 326b, the gate interconnect 331d, and the pads 327b and 327c constitute the upper transistor of the transistor RPG2.

In the lower part of the SRAM cell, local interconnects 341a, 341b, and 341c extending in the X direction are formed. The local interconnect 341a is connected to the pads 322a and 222a. The local interconnect 341b and 341c are connected to the pads 322b and 322c, respectively. In the upper part of the SRAM cell, local interconnects 343a and 343b extending in the X direction are formed. The local interconnects 343a and 343b are connected to the pads 327a and 327b, respectively.

The local interconnect 341a is connected to the lower power supply line 211 through a contact 351a, and is connected to the upper local interconnect 343a through a contact 352a. Local 341b is connected to the upper local interconnect 343b through a contact 352b. The local interconnect 341c is connected to the upper M1 interconnect 361 through a contact 353a. The contact 353a is formed at the same position in the Y direction as the contact 253c.

The gate interconnect 331a and the gate interconnect 331c are connected to each other through a shared contact 254a and an inter-gate contact 255a. The gate interconnect 331b and the gate interconnect 331d are connected to each other through an inter-gate contact 355a. The gate interconnect 331d is connected to the M1 interconnect 362 through a contact 356b.

The M2 interconnect 371 is connected to the M1 interconnect 362 through the contact 357a, and is connected to the M1 interconnect 264 through the contact 257a. The M2 interconnect 372 is connected to the M1 interconnect 265 through the contact 257b.

According to the present alteration, the similar effects to those of the above-described embodiment can be obtained. That is, in a configuration in which a plurality of SRAM cells are arranged side by side in the Y direction, the contact 253a connecting each SRAM cell to the M1 interconnect 261 serving as the write bit line WBL and the contact 253b connecting each SRAM cell to the M1 interconnect 262 serving as the write bit line WBLX can be arranged in alignment in the Y direction. In addition, the transistors RPG1 and RPG2 are formed at the same position in the Y-direction as each other. Thus, in a configuration in which a plurality of SRAM cells are arranged side by side in the Y direction, the contact 253c connecting each SRAM cell to the M1 interconnect 263 serving as the read bit line RBL and the contact 353a connecting each SRAM cell to the M1 interconnect 361 serving as the read bit line RBLX can be arranged in alignment in the Y direction. Therefore, since the load capacitance between the bit lines constituting the complementary bit line pair can be kept balanced, good characteristics can be realized for SRAM cells using CFETs.

The SRAM cell according to the first and second embodiments includes a region where a P-type transistor is in the upper part of CFETs, and a region which an N-type transistor is in the upper part of CFETs. In such a layout structure, transistors in the upper part may be formed, for example, as follows. That is, when forming transistors in the upper part, regions of N-type transistors are masked and other regions are doped into the P conductivity type. Subsequently, regions other than N-type transistors are masked and doped into an N conductivity type. By placing N-type transistors and P-type transistors apart from each other, it is possible to reliably perform doping of the P conductivity type and doping of the N conductivity type.

Other Examples

In each of the embodiments described above, each transistor is assumed to comprise one nanowire, but a part or all of transistors may comprise a plurality of nanowires. In this case, a plurality of nanowires may be provided in the X direction as viewed in plan, or a plurality of nanowires may be provided in the Z direction. Further, a plurality of nanowires may be provided in both the X direction and the Z direction, respectively. Further, in the upper part and lower part of the cell, the number of nanowires comprised by the transistor may be different.

In each embodiment described above, the cross-sectional shape of the nanowire is substantially square, but not limited thereto. For example, it may be a circular or a rectangle.

In each embodiment described above, a nanowire FET has been described as an example of a three-dimensional transistor, to which is not limited. For example, the transistor formed at the lower part of the cell may be a fin-type transistor.

In the present disclosure, for a semiconductor storage device having SRAM cells using CFETs, since the layout structure in which good properties can be obtained can be realized, for example, it is useful for improving the performance of the semiconductor chip.

What is claimed is:

1. A semiconductor storage device including an SRAM (Static Random Access Memory) cell, the SRAM cell comprising:
    a first transistor, one node of which is connected to a first power supply for supplying a first voltage, the other node of which is connected to a first node, and a gate of which is connected to a second node;
    a second transistor, one node of which is connected to the first power supply, the other node of which is connected to the second node, and a gate of which is connected to the first node;
    a third transistor, one node of which is connected to the first node, the other node of which is connected to a second power supply for supplying a second voltage different from the first voltage, and a gate of which is connected to the second node;
    a fourth transistor, one node of which is connected to the second node, the other node of which is connected to the second power supply, and a gate of which is connected to the first node;
    a fifth transistor, one node of which is connected to a first bit line, the other node of which is connected to the first node, and a gate of which is connected to a first word line; and
    a sixth transistor, one node of which is connected to a second bit line constituting a complementary bit line pair with the first bit line, the other node of which is connected to the second node, and a gate of which is connected to the first word line, wherein:
    each of the first and second transistors is a three-dimensional transistor of a first conductivity type formed in a first layer,
    each of the third to sixth transistors is a three-dimensional transistor of a second conductivity type different from the first conductivity type, and is formed in a second layer different from the first layer,
    the first and second transistors overlap the third and fourth transistors as viewed in plan at least partially, respectively,
    the first to fourth transistors are disposed to have a same position coordinate in a first direction in which channel portions of the first to sixth transistors extend, as each other so that the first to fourth transistors are located over a first line extending in a second direction perpendicular to the first direction as viewed in plan, and
    the fifth and sixth transistors are disposed to have a same position coordinate in the first direction as each other so that the fifth and sixth transistors are located over a second line extending in the second direction as viewed in plan.

2. The semiconductor storage device of claim 1, wherein:
    the first and second bit lines extend in the first direction, and
    in the SRAM cell,
        one node of the fifth transistor is connected to the first bit line through a first contact,
        one node of the sixth transistor is connected to the second bit line through a second contact, and
        the first and second contacts are disposed to have a same position coordinate in the first direction as each other so that the first and second contacts are located over a third line extending in the second direction as viewed in plan.

3. The semiconductor storage device of claim 1, comprising:
    a first power supply line for supplying the first voltage, formed in a same layer as the first and second bit lines; and
    a second power supply line for supplying the second voltage, the second power supply line being a buried interconnect, wherein:
    the first layer is above the second layer, one node of each of the first and second transistors is connected to a local interconnect connected to the first power supply line,
the local interconnect extending in the second direction, and
one node of each of the third and fourth transistors is connected to the second power supply line.

4. The semiconductor storage device of claim 1, comprising:
a first power supply line for supplying the first voltage, the first power supply line being a buried interconnect; and
a second power supply line for supplying the second voltage, formed in a same layer as the first and second bit lines, wherein:
the first layer is below the second layer,
one node of each of the first and second transistors is connected to the first power supply line, and
one node of each of the third and fourth transistors is connected to a local interconnect connected to the second power supply line, the local interconnect extending in the second direction.

5. A semiconductor storage device including an SRAM (Static Random Access Memory) cell, the SRAM cell comprising:
a first transistor, one node of which is connected to a first power supply for supplying a first voltage, the other node of which is connected to a first node, and a gate of which is connected to a second node;
a second transistor, one node of which is connected to the first power supply, the other node of which is connected to the second node, and a gate of which is connected to the first node;
a third transistor, one node of which is connected to the first node, the other node of which is connected to a second power supply for supplying a second voltage different from the first voltage, and a gate of which is connected to the second node;
a fourth transistor, one node of which is connected to the second node, the other node of which is connected to the second power supply, and a gate of which is connected to the first node;
a fifth transistor, one node of which is connected to a first bit line, the other node of which is connected to the first node, and a gate of which is connected to a first word line;
a sixth transistor, one node of which is connected to a second bit line constituting a complementary bit line pair with the first bit line, the other node of which is connected to the second node, and a gate of which is connected to the first word line;
a seventh transistor, one node of which is connected to a third bit line, the other node of which is connected to the first node, and a gate of which is connected to a second word line; and
an eighth transistor, one node of which is connected to a fourth bit line constituting a complementary bit line pair with the third bit line, the other node of which is connected to the second node, and a gate of which is connected to the second word line, wherein:
each of the first and second transistors is a three-dimensional transistor of a first conductivity type formed in a first layer,
each of the third and fourth transistors is a three-dimensional transistor of a second conductivity type different from the first conductivity type, formed in a second layer different from the first layer,
the first and second transistors overlap the third and fourth transistors as viewed in plan at least partially, respectively,
the first to fourth transistors are disposed to have formed at a same position in a first direction in which channel portions of the first to eighth transistors extend, as each other, so that the first to fourth transistors are located over a first line extending in a second direction perpendicular to the first direction as viewed in plan,
the fifth and sixth transistors are formed in one of the first and second layers,
the seventh and eighth transistors are formed in one of the first and second layers, and
the fifth to eighth transistors are disposed to have a same position coordinate in the first direction as each other in the first direction so that the fifth to eighth transistors are located over a second line extending in the second direction as viewed in plan.

6. The semiconductor storage device of claim 5, wherein:
the first to fourth bit lines extend in the first direction, and
in the SRAM cell,
one node of the fifth transistor is connected to the first bit line through a first contact,
one node of the sixth transistor is connected to the second bit line through a second contact,
one node of the seventh transistor is connected to the third bit line through a third contact,
one node of the eighth transistor is connected to the fourth bit line through a fourth contact, and
the first to fourth contacts are disposed to have a same position coordinate in the first direction as each other so that the first to fourth contacts are located over a third line extending in the second direction as viewed in plan.

7. The semiconductor storage device of claim 5, wherein:
the fifth and sixth transistors are formed in one of the first and second layers, and
the seventh and eighth transistors are formed in the other of the first and second layers.

8. The semiconductor storage device of claim 5, comprising:
a first power supply line for supplying the first voltage, the first power supply line being a buried interconnect; and
a second power supply line for supplying the second voltage, the second power supply line being a buried interconnect, wherein:
one node of each of the first and second transistor is connected to the first power supply line, and
one node of each of the third and fourth transistors is connected to the second power supply line.

9. A semiconductor storage device including an SRAM (Static Random Access Memory) cell, the SRAM cell comprising:
a first transistor, one node of which is connected to a first power supply for supplying a first voltage, the other node of which is connected to a first node, and a gate of which is connected to a second node;
a second transistor, one node of which is connected to the first power supply, the other node of which is connected to the second node, and a gate of which is connected to the first node;
a third transistor, one node of which is connected to the first node, the other node of which is connected to a second power supply for supplying a second voltage different from the first voltage, and a gate of which is connected to the second node;

a fourth transistor, one node of which is connected to the second node, the other node of which is connected to the second power supply, and a gate of which is connected to the first node;

a fifth transistor, one node of which is connected to a first write bit line, the other node of which is connected to the first node, and a gate of which is connected to a write word line;

a sixth transistor, one node of which is connected to a second write bit line constituting a complementary bit line pair with the first write bit line, the other node of which is connected to the second node, and a gate of which is connected to the write word line;

a seventh transistor, one node of which is connected to the second power supply and a gate of which is connected to the second node; and an eighth transistor, one node of which is connected to a first read bit line, the other node of which is connected to the other node of the seventh transistor, and a gate of which is connected to a read word line, wherein:

each of the first and second transistors is a three-dimensional transistor of a first conductivity type formed in a first layer, each of the third to sixth transistors is a three-dimensional transistor of a second conductivity type different from the first conductivity type, formed in a second layer different from the first layer, the first and second transistors overlap the third and fourth transistors as viewed in plan at least partially, respectively, the first to fourth transistors are disposed to have a same position coordinate in a first direction in which channel portions of the first to eighth transistors extend, as each other, so that the first to fourth transistors are located over a first line extending in a second direction perpendicular to the first direction as viewed in plan, and the fifth and sixth transistors are disposed to have a same position coordinate in the first direction as each other so that the first to fourth transistors are located over a second line extending in the second direction as viewed in plan.

10. The semiconductor storage device of claim 9, wherein:

the first and second write bit lines extend in the first direction, and in the SRAM cell,
one node of the fifth transistor is connected to the first write bit line through a first contact,
one node of the sixth transistor is connected to the second write bit line through a second contact, and
the first and second contacts are disposed to have a same position coordinate in the first direction as each other so that the first and second contacts are located over a third line extending in the second direction as viewed in plan.

11. The semiconductor storage device of claim 9, wherein:

the seventh transistor is disposed to have the same position coordinate in the first direction as the first to fourth transistors, and the eighth transistor is disposed to have the same position coordinate in the first direction as the fifth and sixth transistors.

12. The semiconductor storage device of claim 9, wherein each of the seventh and eighth transistors includes a three-dimensional transistor formed in the first layer and a three-dimensional transistor formed in the second layer.

13. The semiconductor storage device of claim 9, wherein the SRAM cell comprises:

a ninth transistor, one node of which is connected to the second power supply and a gate of which is connected to the first node; and a tenth transistor, one node of which is connected to a second read bit line forming a complementary bit line pair with the first read bit line, the other node of which is connected to the other node of the ninth transistor, and a gate of which is connected to the read word line.

14. The semiconductor storage device of claim 13, wherein:

the first and second read bit lines extend in the first direction, and in the SRAM cell,
one node of the eighth transistor is connected to the first read bit line through a first contact,
one node of the tenth transistor is connected to the second read bit line through a second contact, and
the first and second contacts are disposed to have a same position coordinate in the first direction as each other so that the first and second contacts are located over a third line extending in the second direction as viewed in plan.

15. The semiconductor storage device of claim 13, wherein:

the seventh and ninth transistors are disposed to have the same position in the first direction as the first to fourth transistors, and the eighth and tenth transistors are disposed to have the a same position in the first direction as the fifth and sixth transistors.

16. The semiconductor storage device of claim 13, wherein each of the seventh to tenth transistors includes a three-dimensional transistor formed in the first layer and a three-dimensional transistor formed in the second layer.

* * * * *